(12) United States Patent
Wu et al.

(10) Patent No.: US 11,011,636 B2
(45) Date of Patent: May 18, 2021

(54) FIN FIELD EFFECT TRANSISTOR (FINFET) DEVICE STRUCTURE WITH HARD MASK LAYER OVER GATE STRUCTURE AND METHOD FOR FORMING THE SAME

(71) Applicant: Taiwan Semiconductor Manufacturing Co., Ltd., Hsinchu (TW)

(72) Inventors: Cheng-Han Wu, Hsinchu (TW); Yu-Ho Chiang, Hsinchu (TW); Jyh-Huei Chen, Hsinchu (TW); Jhon-Jhy Liaw, Zhudong Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 48 days.

(21) Appl. No.: 16/199,551

(22) Filed: Nov. 26, 2018

(65) Prior Publication Data
US 2020/0105931 A1    Apr. 2, 2020

Related U.S. Application Data

(60) Provisional application No. 62/737,260, filed on Sep. 27, 2018.

(51) Int. Cl.
*H01L 29/78* (2006.01)
*H01L 29/08* (2006.01)
(Continued)

(52) U.S. Cl.
CPC .... *H01L 29/7848* (2013.01); *H01L 21/02381* (2013.01); *H01L 21/02532* (2013.01);
(Continued)

(58) Field of Classification Search
CPC ......... H01L 29/41791; H01L 29/66795; H01L 21/8234; H01L 29/785; H01L 21/0332; H01L 21/027; H01L 2224/27912
See application file for complete search history.

(56) References Cited

U.S. PATENT DOCUMENTS 8,772,109 B2    7/2014   Colinge
8,785,285 B2    7/2014   Tsai et al.
(Continued)

*Primary Examiner* — Laura M Menz
*Assistant Examiner* — Khatib A Rhaman
(74) *Attorney, Agent, or Firm* — McClure, Qualey & Rodack, LLP

(57) ABSTRACT

A method for forming a FinFET device structure is provided. The method for forming a FinFET device structure includes forming a fin structure over a substrate, and forming a source/drain (S/D) structure over the fin structure. The method for forming a FinFET device structure also includes forming an inter-layer dielectric (ILD) structure covering the S/D structure, and forming a gate structure over the fin structure and adjacent to the S/D structure. The method for forming a FinFET device structure further includes forming a first hard mask layer over the gate structure, and forming a second hard mask layer over the first hard mask layer. In addition, the method for forming a FinFET device structure includes etching the ILD structure to form an opening exposing the S/D structure. The opening and a recess in the second hard mask layer are formed simultaneously.

20 Claims, 26 Drawing Sheets

(51) Int. Cl.
*H01L 29/165* (2006.01)
*H01L 29/417* (2006.01)
*H01L 21/02* (2006.01)
*H01L 21/306* (2006.01)
*H01L 29/66* (2006.01)

(52) U.S. Cl.
CPC .. *H01L 21/02667* (2013.01); *H01L 21/30625* (2013.01); *H01L 29/0847* (2013.01); *H01L 29/165* (2013.01); *H01L 29/41791* (2013.01); *H01L 29/66795* (2013.01); *H01L 29/785* (2013.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,508,719 B2 * | 11/2016 | Chen .................. H01L 21/0335 |
| 9,520,482 B1 | 12/2016 | Chang et al. |
| 9,576,814 B2 | 2/2017 | Wu et al. |
| 9,583,485 B2 * | 2/2017 | Chang ................. H01L 29/4958 |
| 9,634,127 B2 * | 4/2017 | Ching ................. H01L 21/28229 |
| 9,748,144 B1 * | 8/2017 | Lin .................... H01L 29/66545 |
| 2006/0105540 A1 * | 5/2006 | Sakata ............. H01L 21/76281 438/439 |
| 2009/0014786 A1 * | 1/2009 | Lee ....................... H01L 27/105 257/330 |
| 2012/0129338 A1 * | 5/2012 | Kirimura .......... H01L 21/31144 438/637 |
| 2013/0230953 A1 * | 9/2013 | Sudo .................... H01L 29/785 438/268 |
| 2013/0320414 A1 * | 12/2013 | Fan .................. H01L 21/28247 257/288 |
| 2014/0264480 A1 * | 9/2014 | Tsao .................. H01L 21/76834 257/288 |
| 2016/0365446 A1 * | 12/2016 | Chang ................... H01L 29/785 |
| 2017/0005165 A1 * | 1/2017 | Chen ................. H01L 29/66545 |
| 2017/0033194 A1 * | 2/2017 | Chen .................. H01L 29/0653 |
| 2018/0068951 A1 * | 3/2018 | Hung .................... H01L 27/092 |
| 2018/0308750 A1 * | 10/2018 | Cheng .............. H01L 23/53257 |
| 2019/0057899 A1 * | 2/2019 | Huang ............. H01L 21/76897 |
| 2019/0198323 A1 * | 6/2019 | Lee ....................... H01L 21/762 |

* cited by examiner

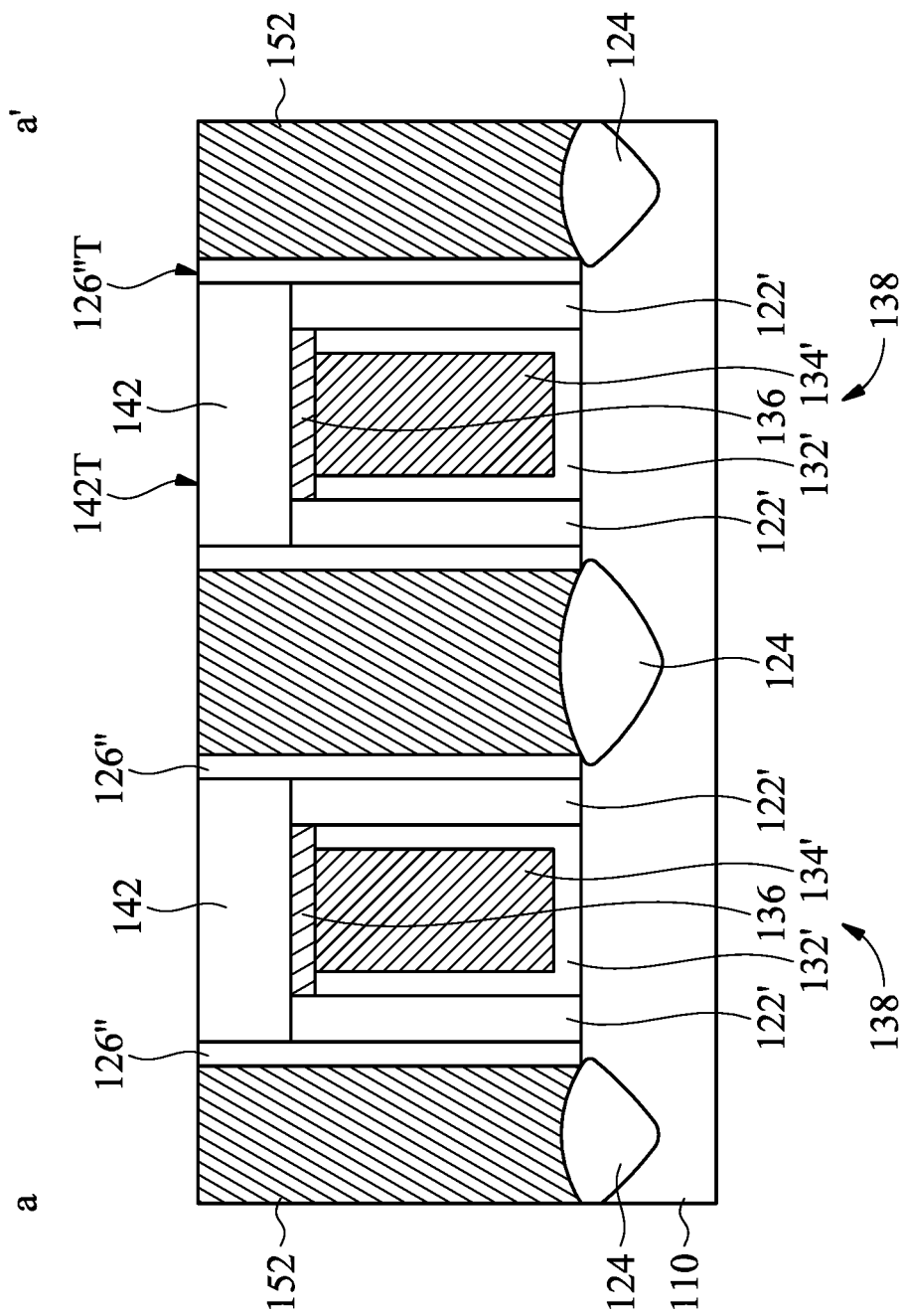

FIN FIELD EFFECT TRANSISTOR (FINFET) DEVICE STRUCTURE WITH HARD MASK LAYER OVER GATE STRUCTURE AND METHOD FOR FORMING THE SAME

CROSS REFERENCE TO RELATED APPLICATIONS

This Application claims the benefit of U.S. Provisional Application No. 62/737,260 filed on Sep. 27, 2018, and entitled "Fin field effect transistor (FinFET) device structure and method for forming the same", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-2F are cross-sectional representations of various stages of forming a FinFET device structure shown in FIGS. 1K-1P, in accordance with some embodiments of the disclosure.

DETAILED DESCRIPTION

Figure 1A:
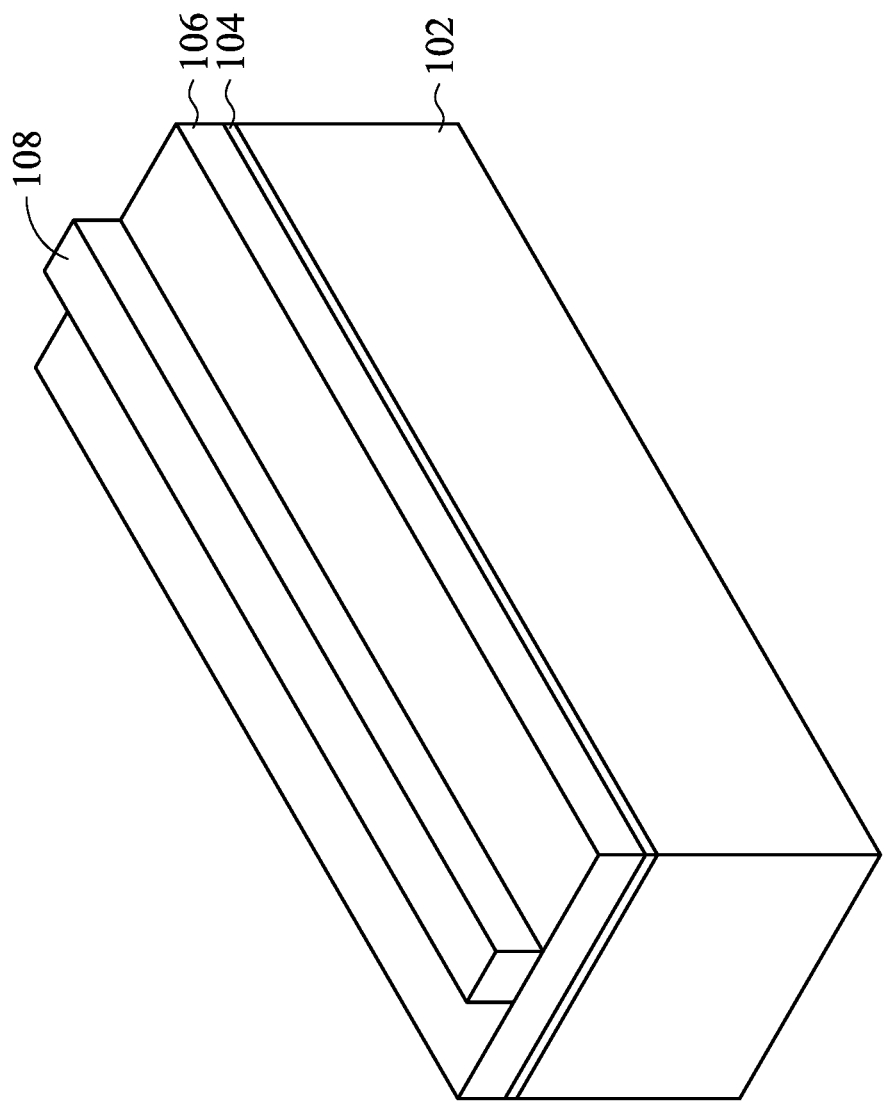
FIGS. 1A-1P are perspective representations of various stages of forming a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Fin structures described below may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

Embodiments for forming a fin field effect transistor (FinFET) device structure are provided. The method for forming the FinFET device structure may include forming a first hard mask layer over a gate structure, and forming a second hard mask layer over the first hard mask layer. The method may also include etching an inter-layer dielectric (ILD) structure to form an opening exposing a source/drain (S/D) structure, so a contact may be formed over the S/D structure. By forming two hard mask layers over the gate structure, the gate structure may be protected and the resistance of the region above the gate structure may be decreased.

Figure 1B:
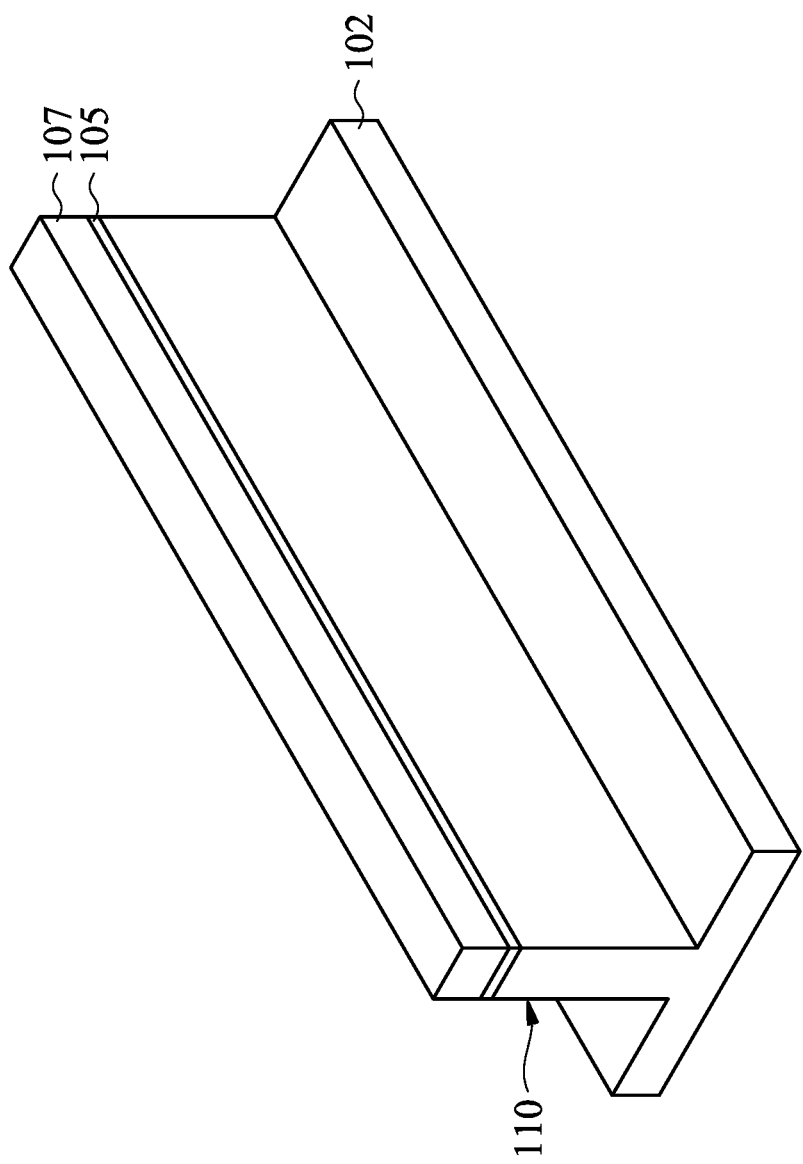
Figure 1C:
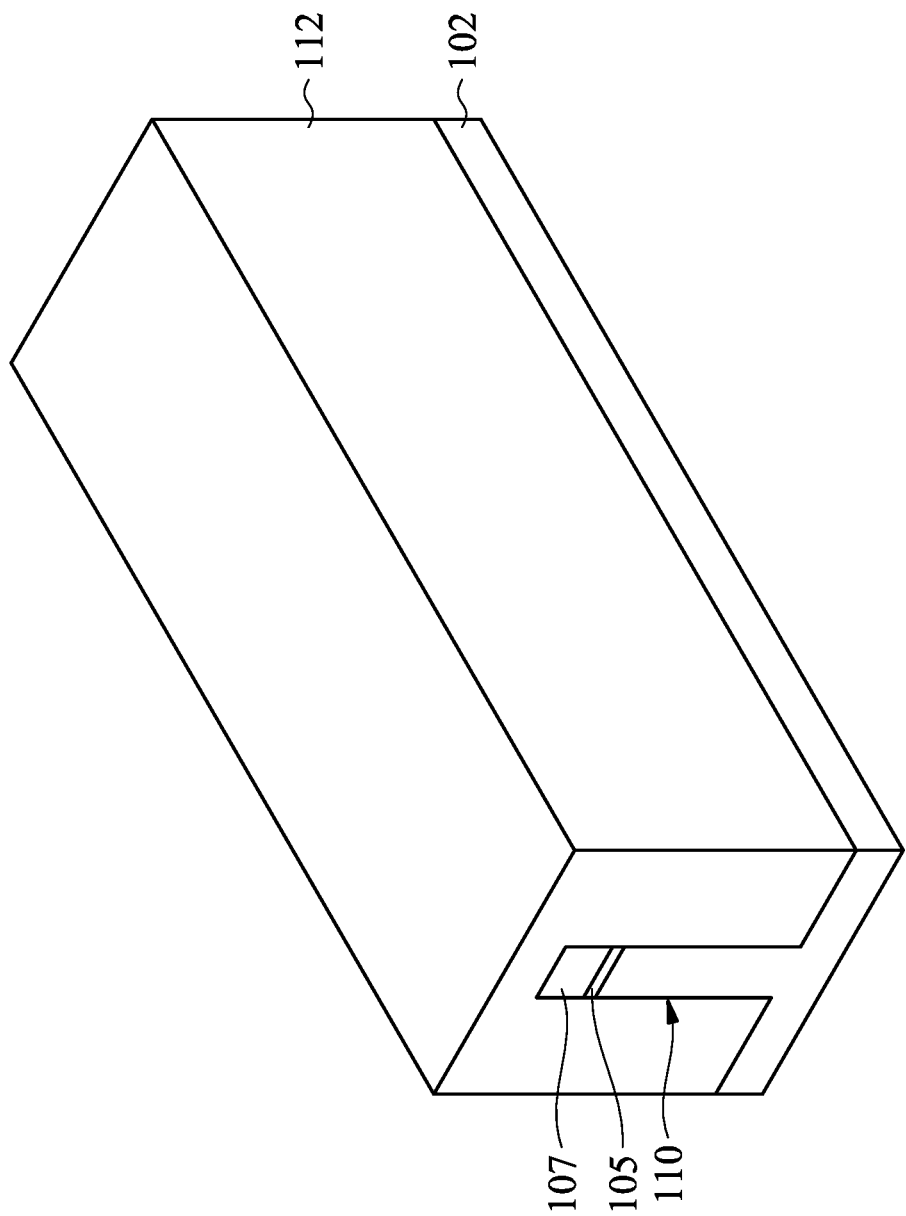
Figure 1D:
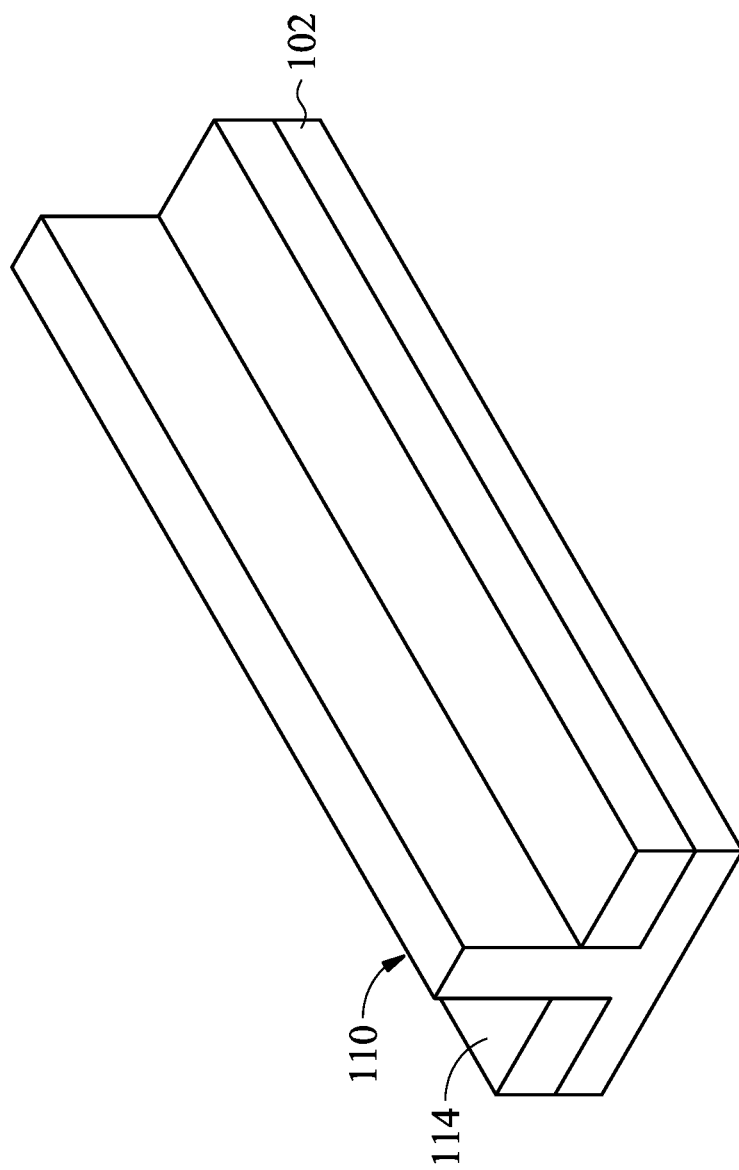
Figure 1E:
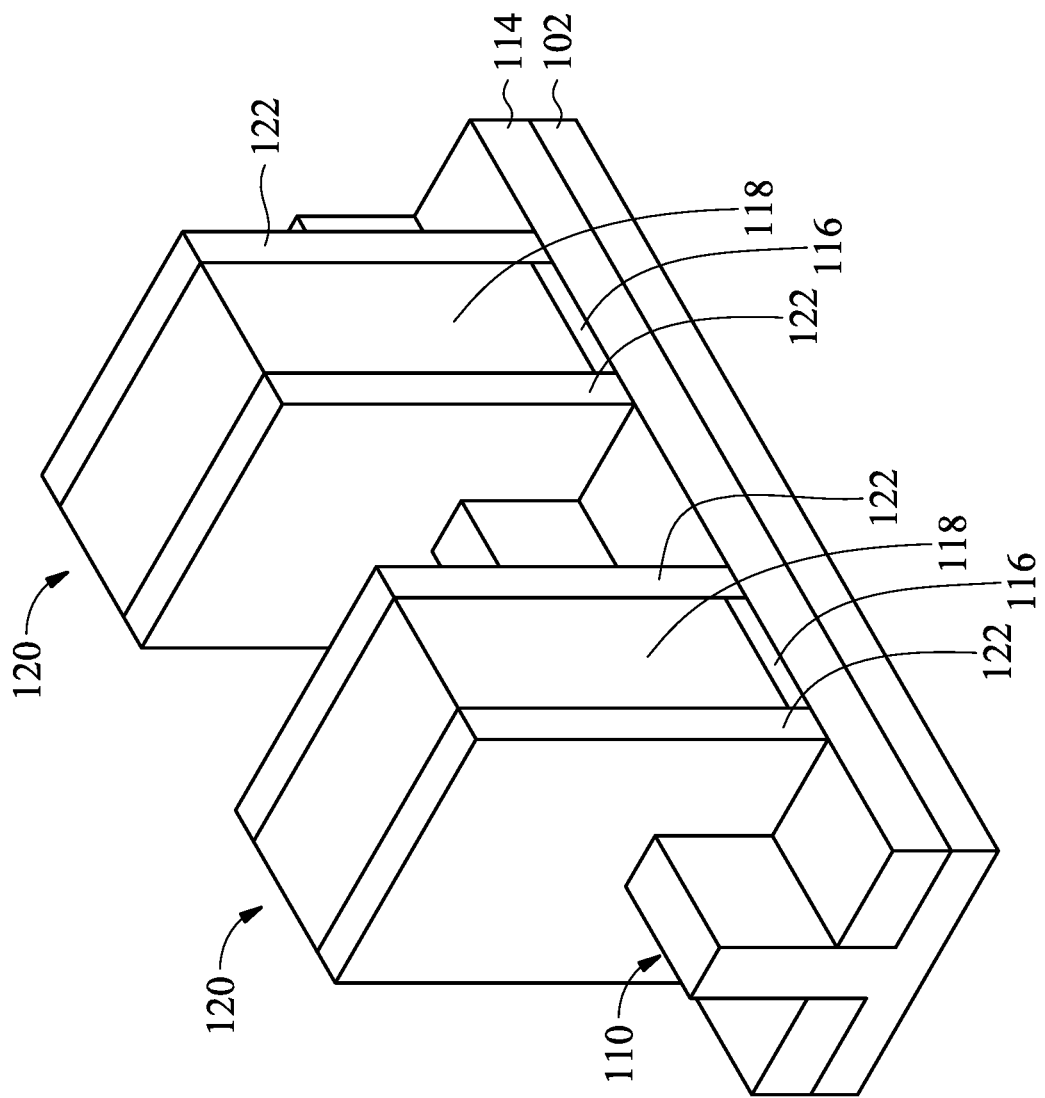
Figure 1F:
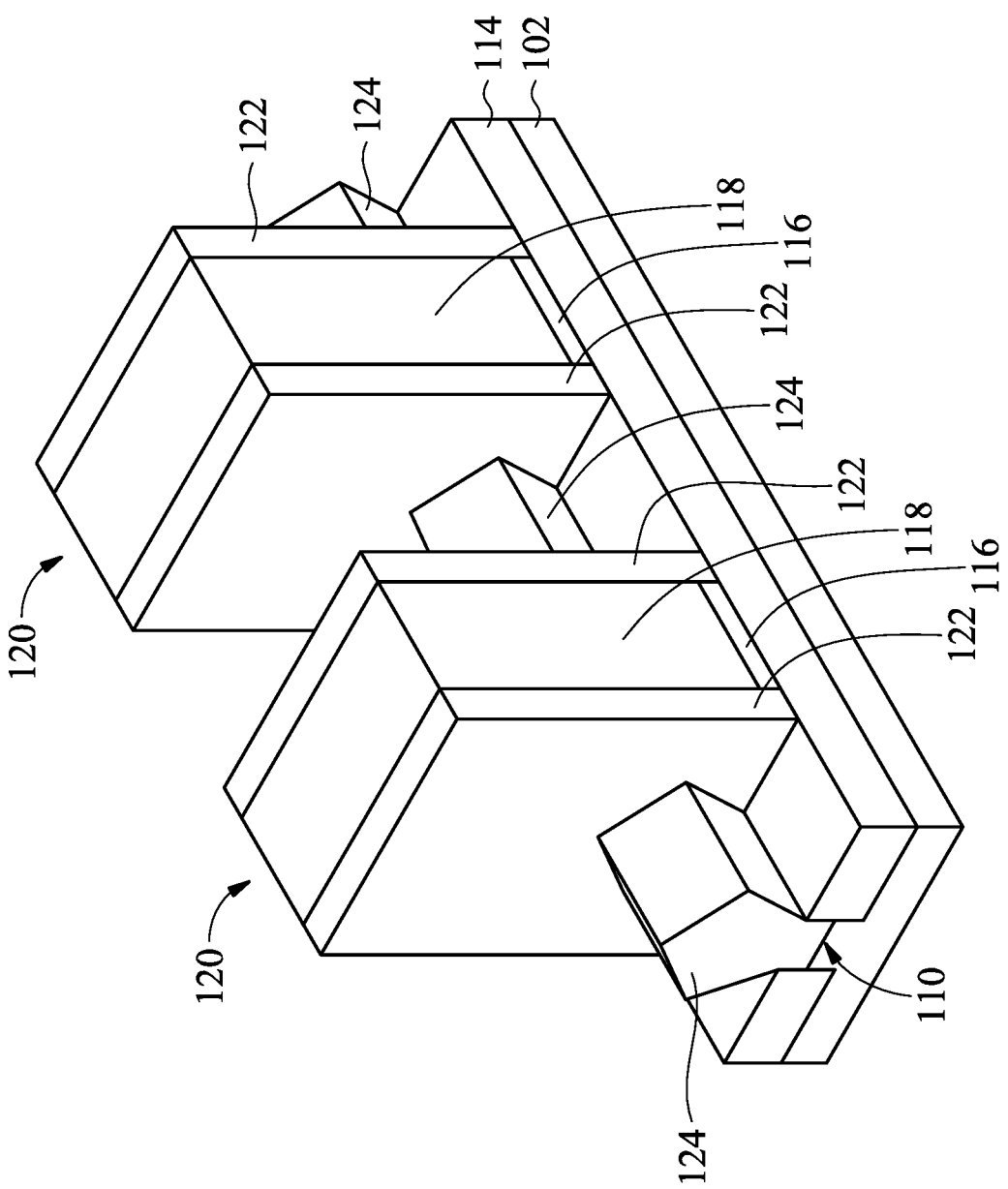
Figure 1G:
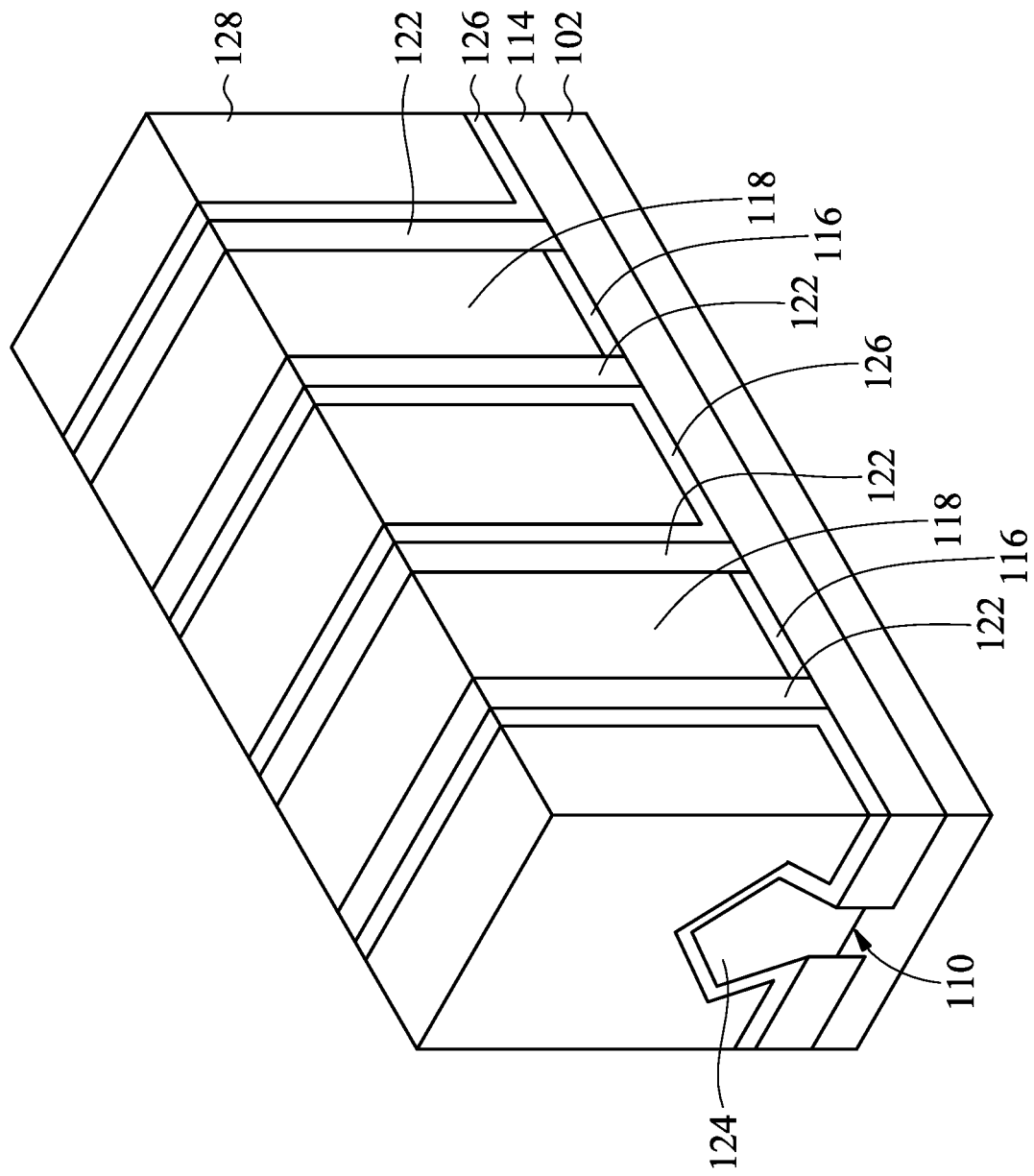
Figure 1H:
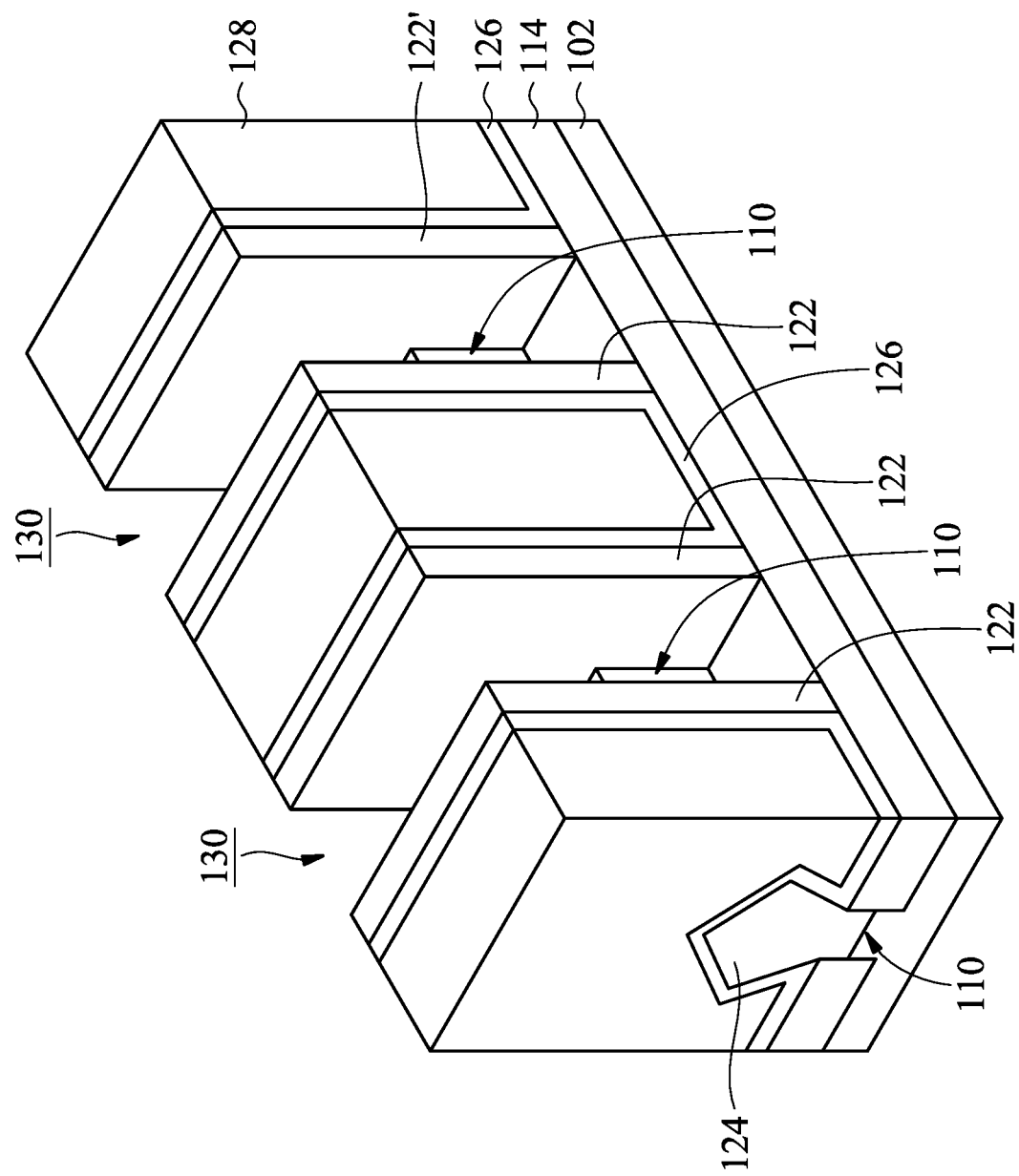
Figure 1I:
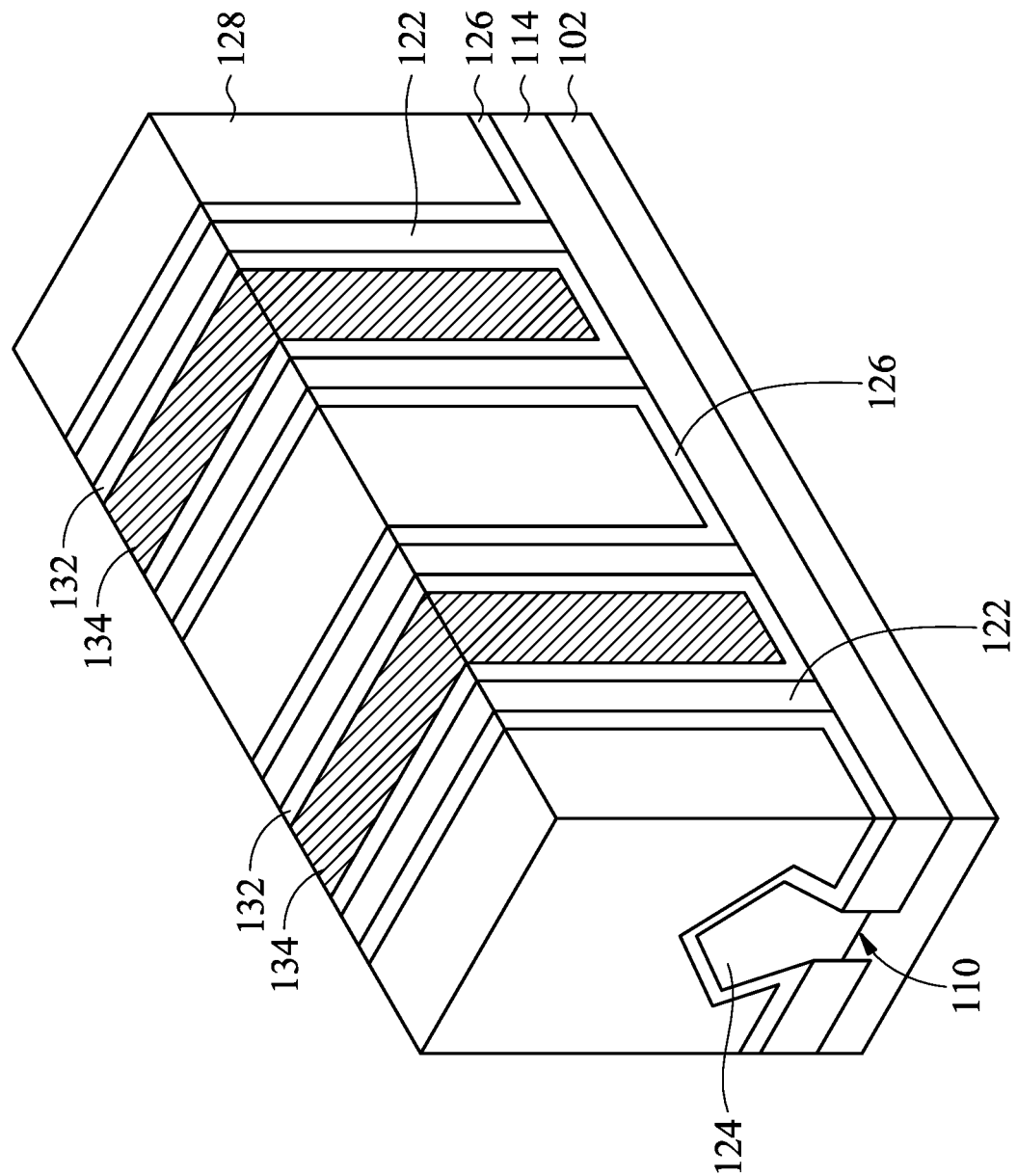
Figure 1J:
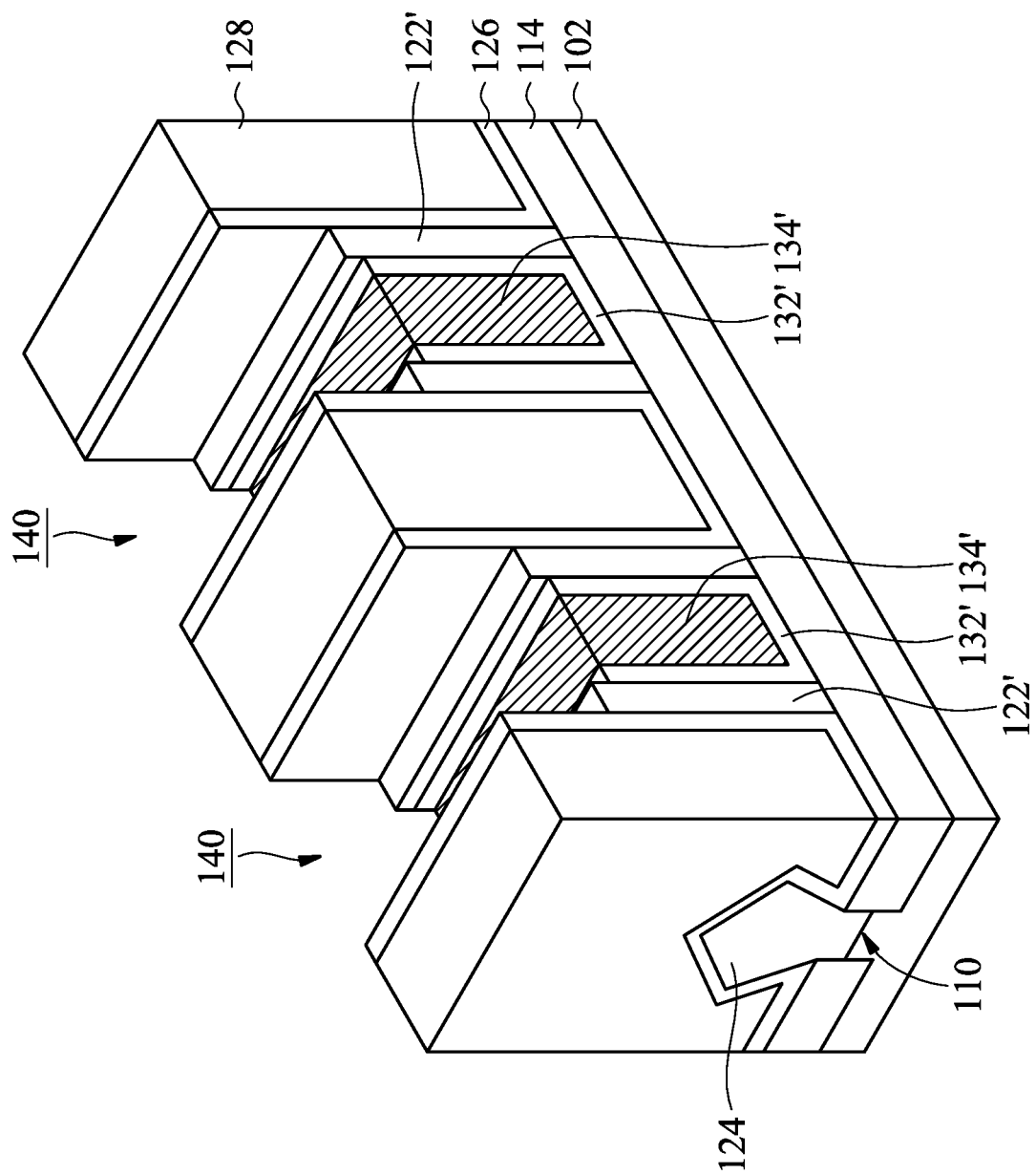
Figure 1K:
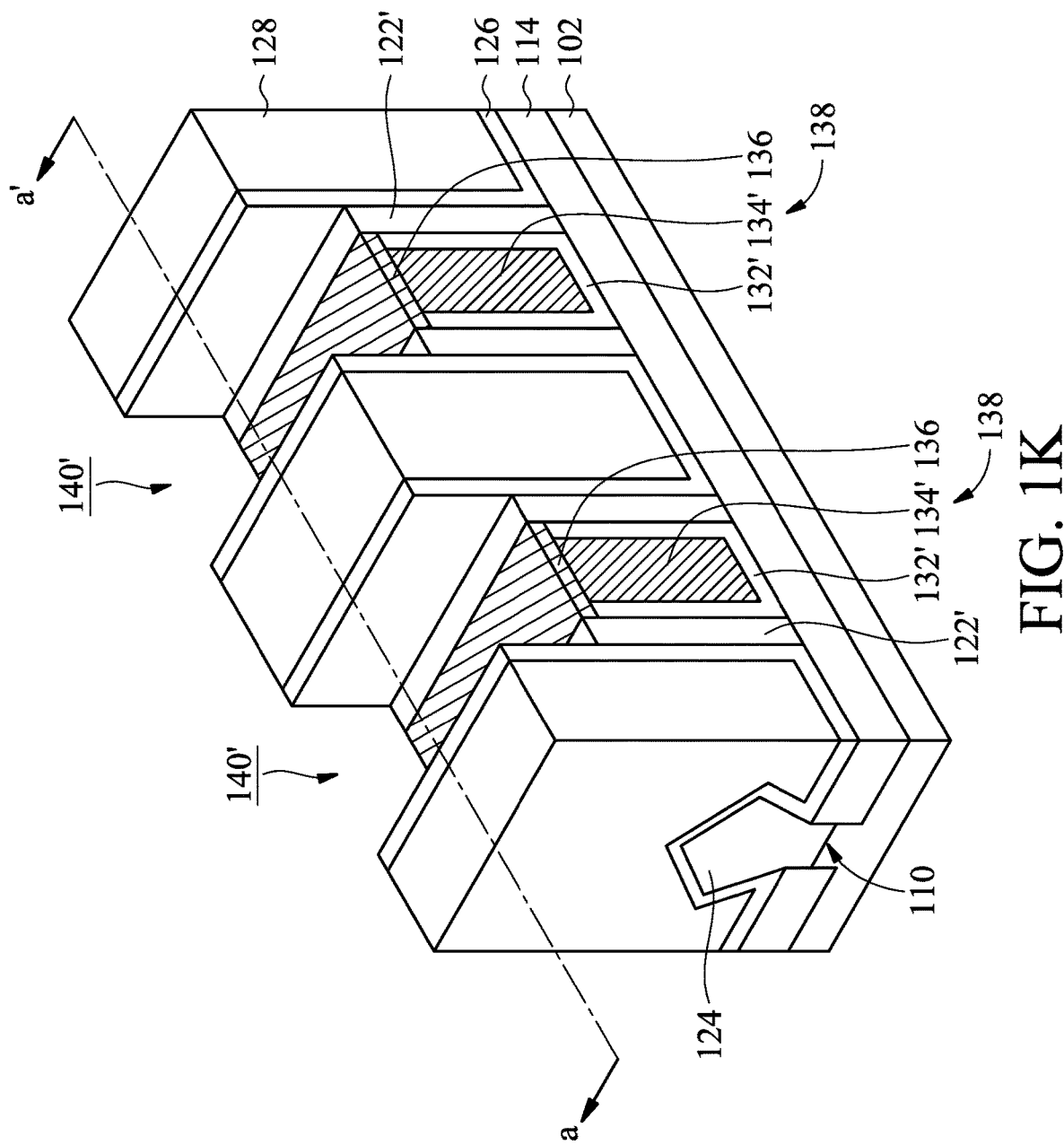
Figure 1L:
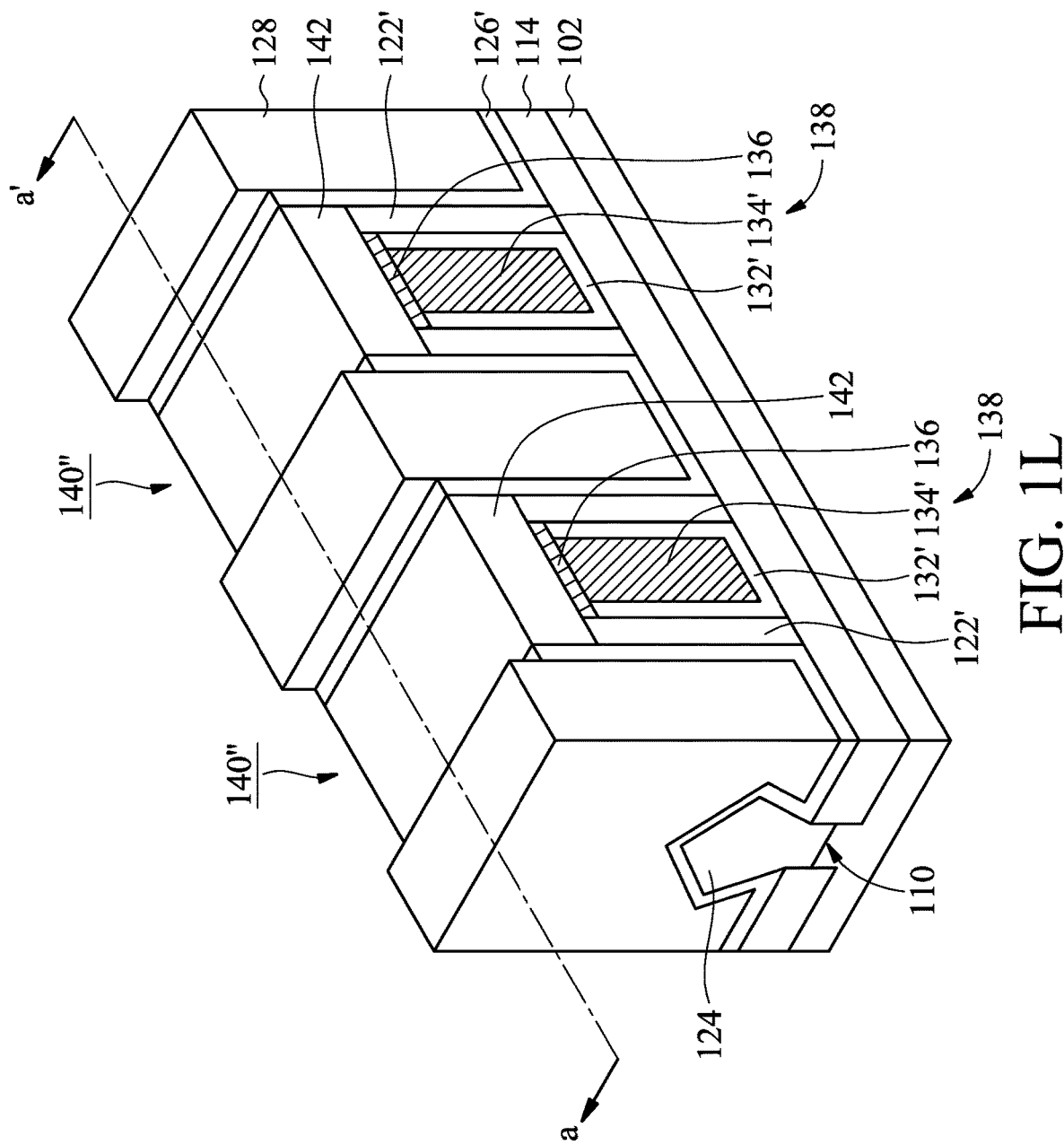
Figure 1M:
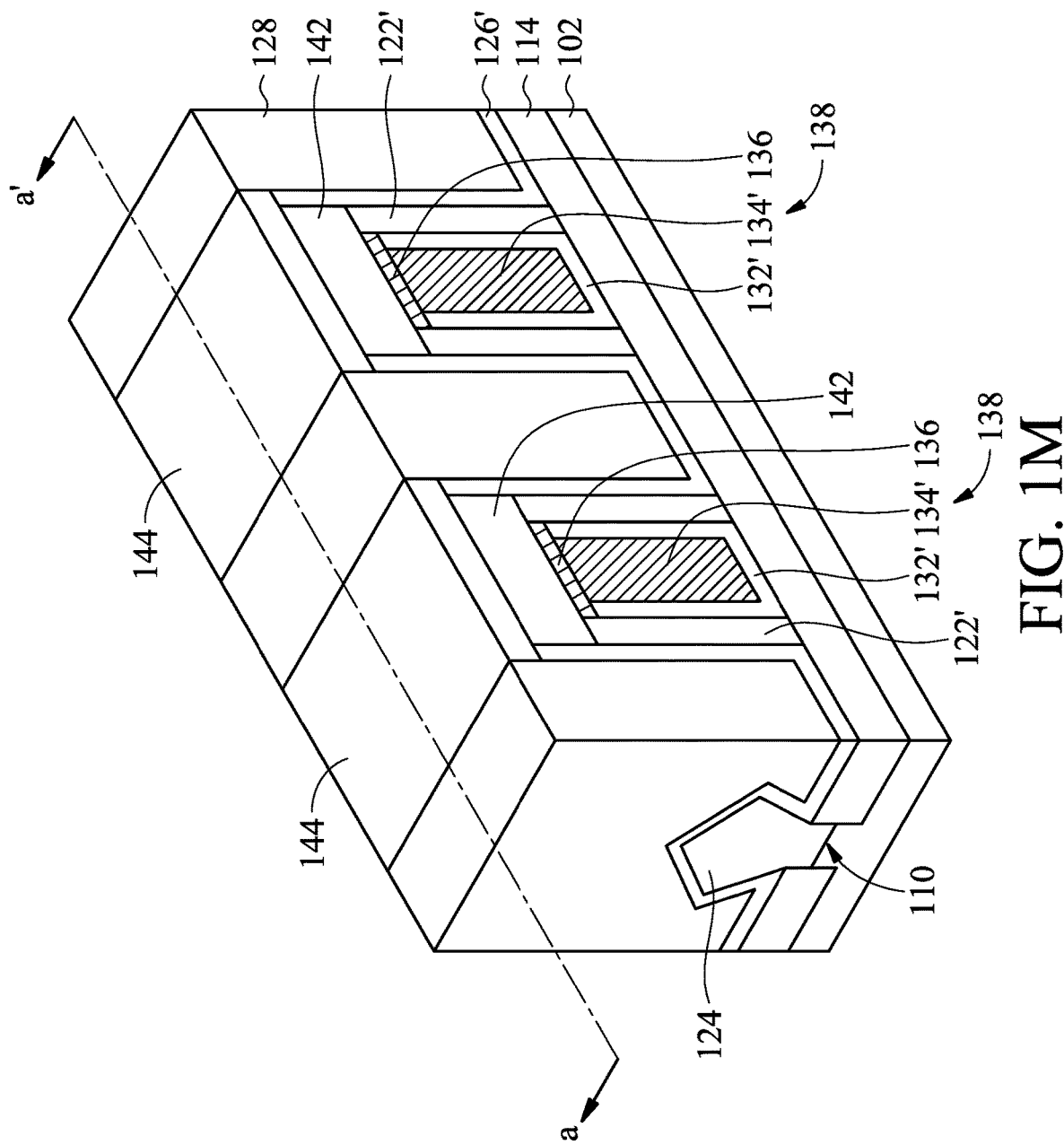
Figure 1N:
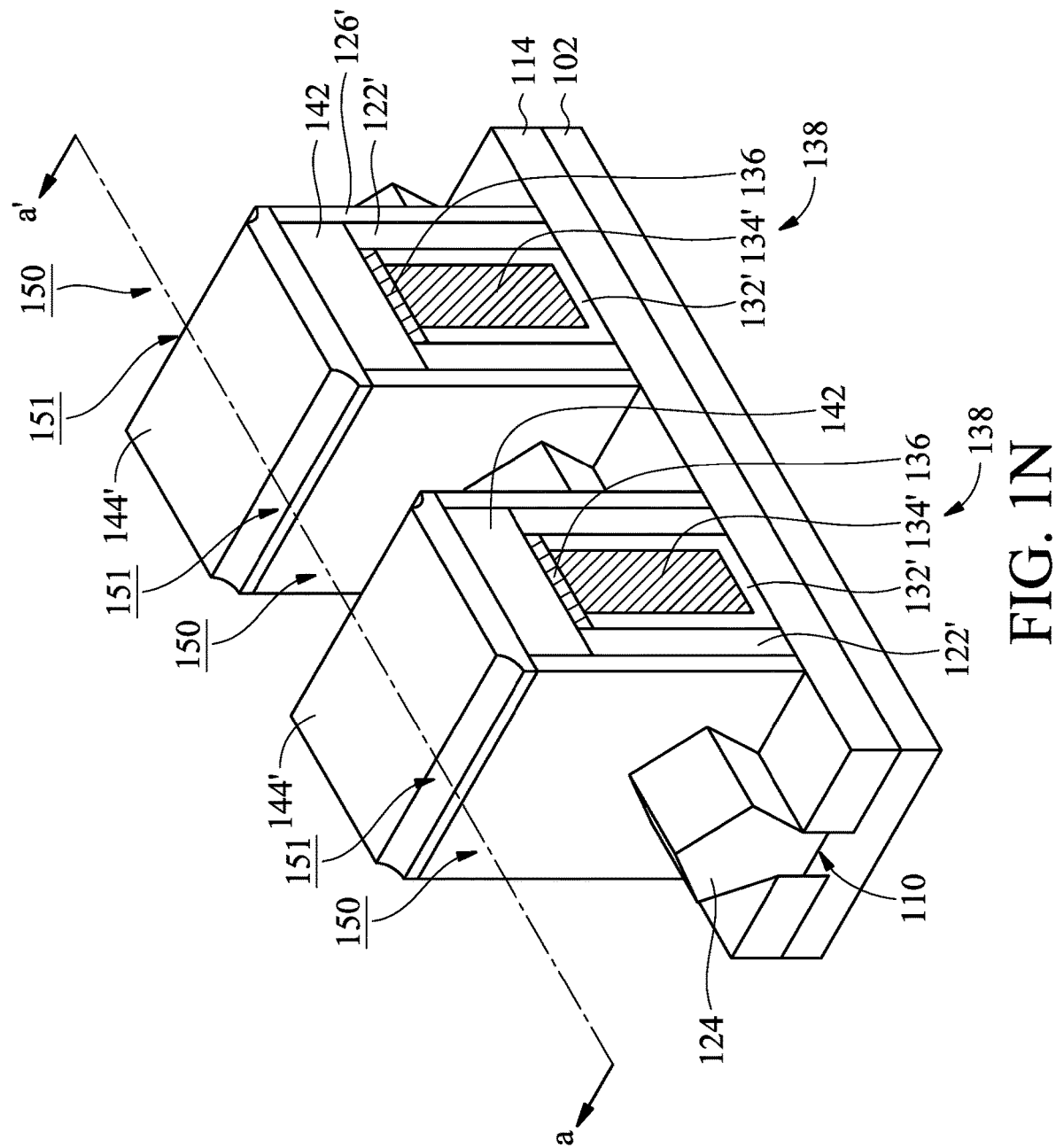
Figure 10:
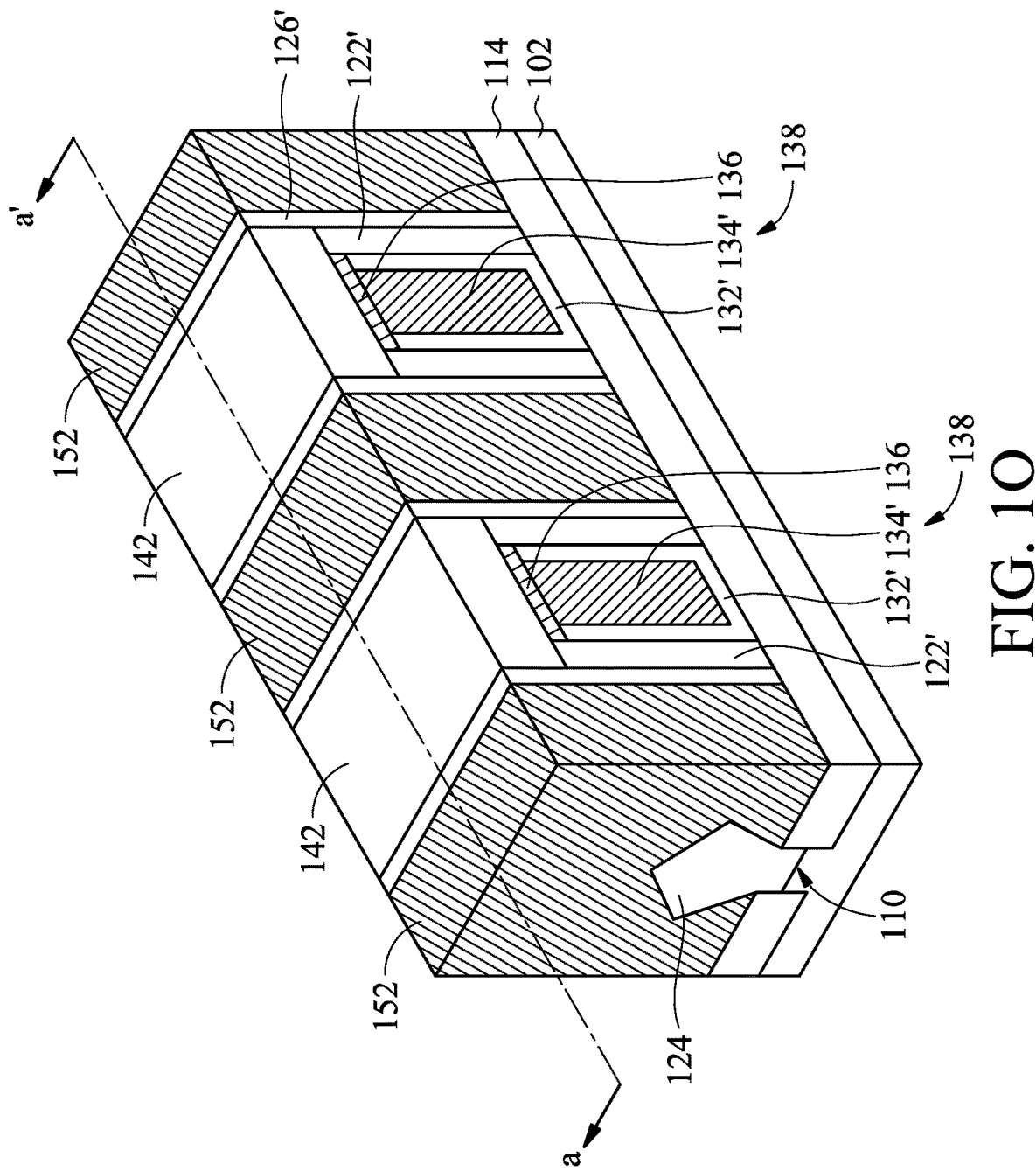
Figure 1P:
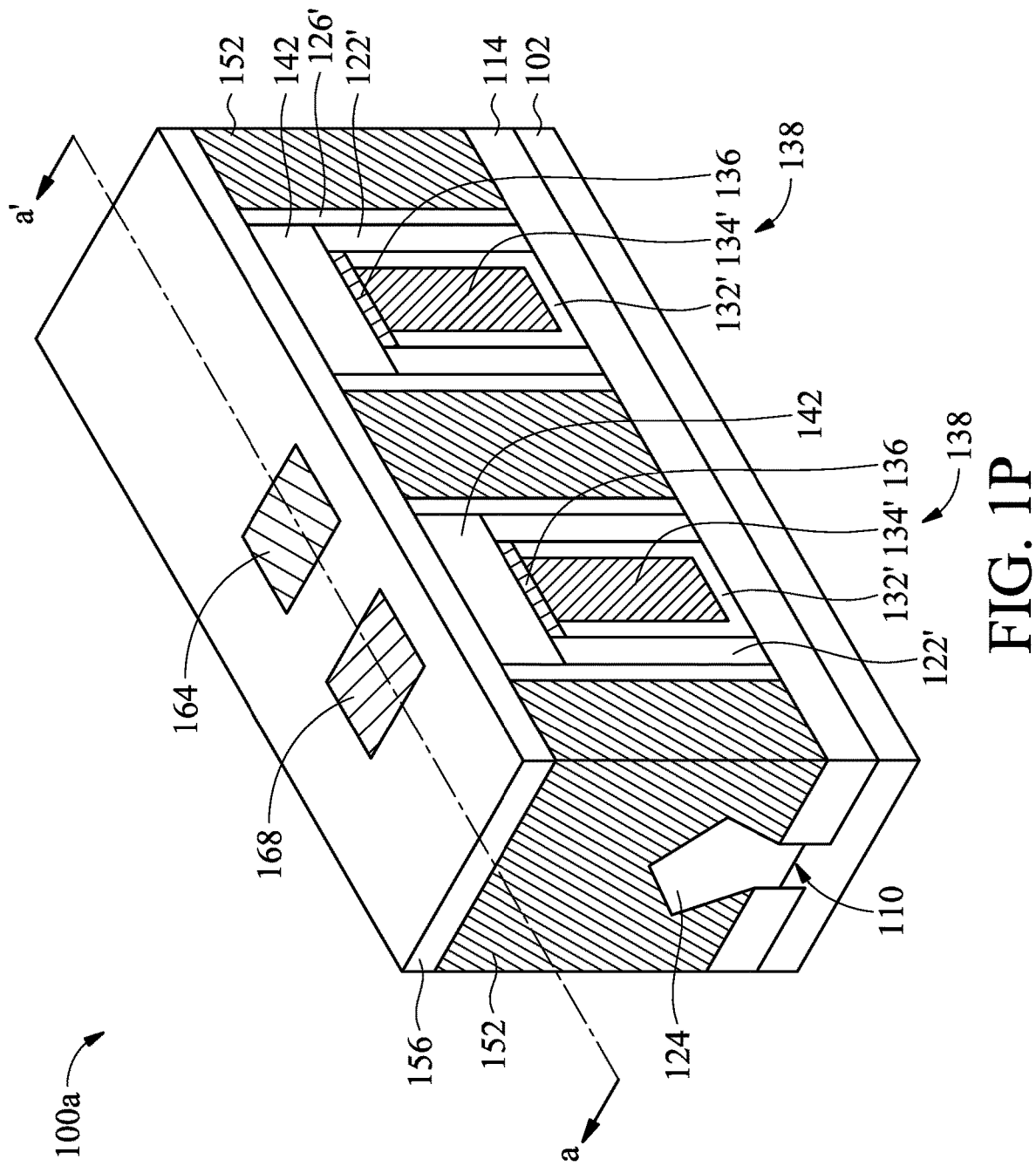

FIGS. 1A-1P are perspective representations of various stages of forming a FinFET device structure 100a, in accordance with some embodiments of the disclosure. FIGS. 2A-2F are cross-sectional representations of various stages of forming the FinFET device structure 100a shown in FIGS. 1A-1P, in accordance with some embodiments of the disclosure. FIGS. 2A-2F are cross-sectional representations taken along line a-a' of FIGS. 1K-1P.

A substrate 102 is provided, as shown in FIG. 1A in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. In some embodiments, the substrate 102 includes an epitaxial layer. For example, the substrate 102 has an epitaxial layer overlying a bulk semiconductor.

Afterwards, a dielectric layer 104 and a mask layer 106 are formed over the substrate 102, and a patterned photoresist layer 108 is formed over the mask layer 106, as shown in FIG. 1A in accordance with some embodiments. The patterned photoresist layer 108 may be formed by a deposition process and a patterning process.

The deposition process for forming the patterned photoresist layer 108 may include a chemical vapor deposition (CVD) process, a high-density plasma chemical vapor deposition (HDPCVD) process, a spin-on process, a sputtering process, or another applicable process. The patterning process for forming the patterned photoresist layer 108 may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

Moreover, the dielectric layer 104 may be a buffer layer between the substrate 102 and the mask layer 106. In some embodiments, the dielectric layer 104 is used as a stop layer when the mask layer 106 is removed. The dielectric layer 104 may be made of silicon oxide. The mask layer 106 may be made of silicon oxide, silicon nitride, silicon oxynitride, or another applicable material. In some embodiments, more than one mask layer 106 is formed over the dielectric layer 104.

The dielectric layer 104 and the mask layer 106 may be formed by deposition processes, which may include a chemical vapor deposition (CVD) process, a high-density plasma chemical vapor deposition (HDPCVD) process, a spin-on process, a sputtering process, or another applicable process.

After the patterned photoresist layer 108 is formed, the dielectric layer 104 and the mask layer 106 are patterned by using the patterned photoresist layer 108 as a mask, as shown in FIG. 1B in accordance with some embodiments. As a result, a patterned dielectric layer 105 and a patterned mask layer 107 are obtained. Afterwards, the patterned photoresist layer 108 is removed.

Next, an etching process is performed on the substrate 102 to form a fin structure 110 by using the patterned dielectric layer 105 and the patterned mask layer 107 as a mask. The etching process may be a dry etching process or a wet etching process.

In some embodiments, the substrate 102 is etched by a dry etching process. The dry etching process includes using a fluorine-based etchant gas, such as $SF_6$, $C_xF_y$, $NF_3$ or a combination thereof. The etching process may be a time-controlled process, and continue until the fin structure 110 reaches a predetermined height. In some embodiments, the fin structure 110 has a width that gradually increases from the top portion to the lower portion.

After the fin structure 110 is formed, an insulating layer 112 is formed to cover the fin structure 110, the patterned dielectric layer 105, and the patterned mask layer 107 over the substrate 102, as shown in FIG. 1C in accordance with some embodiments. In some embodiments, the insulating layer 112 is made of silicon oxide, silicon nitride, silicon oxynitride, fluoride-doped silicate glass (FSG), or another low-k dielectric material. The insulating layer 112 may be deposited by a chemical vapor deposition (CVD) process, a spin-on-glass process, or another applicable process.

Next, the insulating layer 112 is thinned or planarized to expose the top surface of the patterned mask layer 107. In some embodiments, the insulating layer 112 is thinned by a chemical mechanical polishing (CMP) process. Afterwards, the patterned dielectric layer 105 and the patterned mask layer 107 are removed.

After the patterned dielectric layer 105 and the patterned mask layer 107 are removed, an upper portion of the insulating layer 112 is removed to form an isolation structure 114, as shown in FIG. 1D in accordance with some embodiments. The isolation structure 114 may be a shallow trench isolation (STI) structure surrounding the fin structure 110.

In some embodiments, a portion of the fin structure 110 is embedded in the isolation structure 114. More specifically, a lower portion of the fin structure 110 is surrounded by the isolation structure 114, while an upper portion of the fin structure 110 protrudes from the isolation structure 114. The isolation structure 114 is configured to prevent electrical interference or crosstalk.

After the isolation structure 114 is formed, dummy gate structures 120 are formed across the fin structure 110 and extend over the isolation structure 114, as shown in FIG. 1E in accordance with some embodiments. In some embodiments, each of the dummy gate structures 120 includes a dummy gate dielectric layer 116 and a dummy gate electrode layer 118 formed over the dummy gate dielectric layer 116. After the dummy gate structures 120 are formed, gate spacers 122 are formed on opposite sidewalls of each of the dummy gate structures 120. Each of the gate spacers 122 may be a single layer or multiple layers.

In order to improve the speed of the FinFET device structure 100a, the gate spacers 122 are made of low-k dielectric materials. In some embodiments, the low-k dielectric materials have a dielectric constant (k value) less than about 4. Examples of low-k dielectric materials include, but are not limited to, silicon oxide, silicon nitride, silicon carbonitride (SiCN), silicon oxide carbonitride (SiOCN), fluorinated silica glass (FSG), carbon doped silicon oxide, amorphous fluorinated carbon, parylene, bis-benzocyclobutenes (BCB), or polyimide.

In some embodiments, the gate spacers 122 are made of an extreme low-k (ELK) dielectric material with a dielectric constant (k) less than about 2.5. In some embodiments, the ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide (SiO$_2$).

Afterwards, source/drain (S/D) structures 124 are formed over the fin structure 110, as shown in FIG. 1F in accordance with some embodiments. In some embodiments, portions of the fin structure 110 adjacent to the dummy gate structures 120 are recessed to form recesses at two sides of the fin structure 110, and a strained material is grown in the recesses by an epitaxial (epi) process to form the S/D structures 124. In addition, the lattice constant of the strained material may be different from the lattice constant of the substrate 102. In some embodiments, the S/D structures 124 include Ge, SiGe, InAs, InGaAs, InSb, GaAs, GaSb, InAlP, InP, or the like.

After the source/drain (S/D) structures 124 are formed, a contact etch stop layer (CESL) 126 is formed over the substrate 102, and an inter-layer dielectric (ILD) structure 128 is formed over the CESL 126. More specifically, the CESL 126 is formed over the S/D structures 124, the isolation structure 114, and the sidewalls of the gate spacers 122. In some embodiments, the CESL 126 is made of silicon nitride, silicon oxynitride, and/or other applicable materials. Moreover, the CESL 126 may be formed by plasma enhanced CVD, low-pressure CVD, atomic layer deposition (ALD), or other applicable processes.

In some embodiments, the ILD structure 128 includes multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of the low-k dielectric materials include, but are not limited to, fluorinated silica glass (FSG), carbon doped silicon oxide, amorphous fluorinated carbon, parylene, bis-benzocyclobutenes (BCB), or polyimide. In addition, the ILD structure 128 may be formed by chemical vapor deposition (CVD), physical vapor deposition, (PVD), atomic layer deposition (ALD), spin-on coating, or another applicable process.

Afterwards, a planarizing process is performed on the ILD structure 128 until the top surfaces of the dummy gate structures 120 are exposed, as shown in FIG. 1G in accordance with some embodiments. After the planarizing process, the top surfaces of the dummy gate structures 120 may be substantially level with the top surfaces of the gate spacers 122 and the ILD structure 128. In some embodiments, the planarizing process includes a grinding process, a chemical mechanical polishing (CMP) process, an etching process, another applicable process, or a combination thereof.

Next, the dummy gate structures 120 are removed to form trenches 130 in the ILD structure 128, as shown in FIG. 1H in accordance with some embodiments. More specifically, each of the trenches 130 is formed between each pair of the gate spacers 122, and the fin structure 110 is exposed by the trenches 130. The dummy gate dielectric layer 116 and the dummy gate electrode layer 118 are removed by an etching process, such as a dry etching process or a wet etching process.

After the trenches 130 are formed, gate dielectric layers 132 and gate electrode layers 134 are formed in the trenches 130, as shown in FIG. 1I in accordance with some embodiments. More specifically, the gate electrode layers 134 are formed over the gate dielectric layers 132, and sidewalls of the gate electrode layers 132 may be covered by the gate dielectric layers 132. In addition, work function layers (not shown) may be formed between each of the gate dielectric layers 132 and each of the gate electrode layers 134.

Each of the gate dielectric layers 132 may be a single layer or multiple layers. In some embodiments, the gate dielectric layers 132 are made of silicon oxide, silicon nitride, silicon oxynitride (SiON), dielectric material(s) with high dielectric constant (high-k), or a combination thereof. In some embodiments, the gate dielectric layers 132 are deposited by a plasma enhanced chemical vapor deposition (PECVD) process or a spin coating process.

Moreover, the gate electrode layers 134 are made of a conductive material such as aluminum (Al), copper (Cu), tungsten (W), titanium (Ti), tantalum (Ta), or another applicable material, in accordance with some embodiments. The gate electrode layers 134 may be formed by a deposition process, such as a chemical vapor deposition (CVD) process, a physical vapor deposition (PVD) process, an atomic layer deposition (ALD) process, a high density plasma CVD (HDPCVD) process, a metal organic CVD (MOCVD) process, or a plasma enhanced CVD (PECVD) process.

The work function layers may be made of metal materials, and the metal materials may include N-work-function metal or P-work-function metal. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal may include titanium nitride (TiN), tungsten nitride (WN), tantalum nitride (TaN), ruthenium (Ru) or a combination thereof.

After the gate dielectric layers 132 and gate electrode layers 134 are formed, top portions of the gate spacers 122, top portions of the gate dielectric layers 132 and top portions of the gate electrode layers 134 are removed, as shown in FIG. 1J in accordance with some embodiments. As a result, the top surfaces of the remaining gate spacers 122' may be higher than the top surfaces of the remaining gate dielectric layers 132' and the top surfaces of the remaining gate electrode layers 134.

In some embodiments, the top portions of the gate spacers 122, the top portions of the gate dielectric layers 132 and the top portions of the gate electrode layers 134 are removed by a single etching process or multiple etching processes, such as dry etching processes. The dry etching processes may include plasma etching processes.

For example, the top portions of the gate spacers 122, the top portions of the gate dielectric layers 132 and the top portions of the gate electrode layers 134 may be removed by a first etching process and a second etching process. After the first etching process is performed, the top surfaces of the gate dielectric layers 132 and the top surfaces of the gate electrode layers 134 may be substantially level with the top surfaces of the remaining gate spacers 122'. Then, portions of the gate dielectric layers 132 and the gate electrode layers 134 are further removed during the second etching process while the remaining gate spacers 122' are not removed, as shown in FIG. 1J in accordance with some embodiments.

In some embodiments, the top surface of the CESL 126 is higher than the top surfaces of the remaining gate spacers 122'. In addition, openings 140 above the remaining gate spacers 122', the remaining gate dielectric layers 132' and the remaining gate electrode layers 134' are obtained.

Figure 2A:
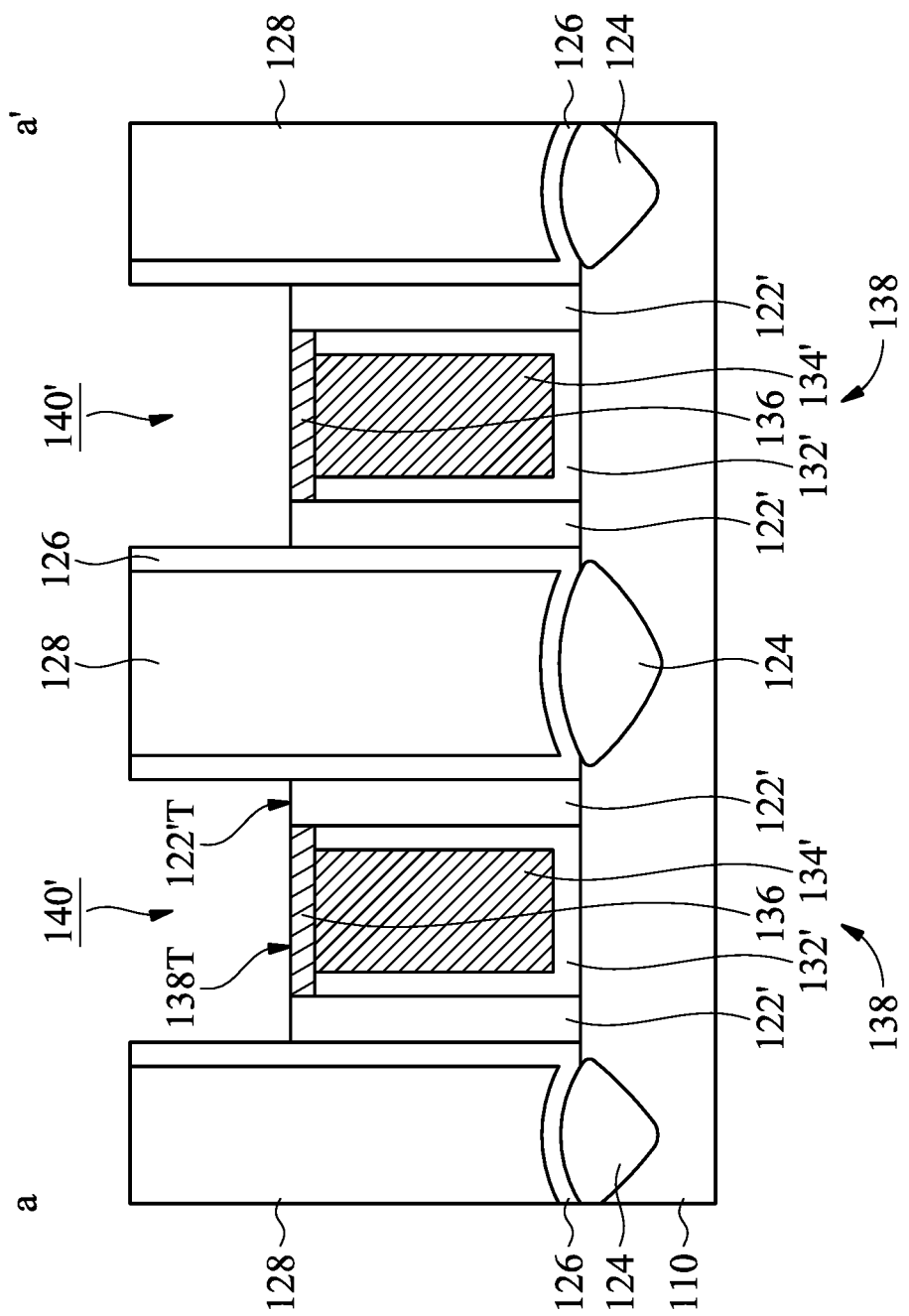

Afterwards, metal cap layers 136 are formed in the openings 140 and covering the remaining gate dielectric layers 132' and the remaining gate electrode layers 134', such that the remaining openings 140' above gate structures 138 are obtained, as shown in FIGS. 1K and 2A in accordance with some embodiments. Each of the gate structures 138 includes one of the metal cap layers 136, one of the remaining gate electrode layers 134', and one of the remaining gate dielectric layers 132'. In some embodiments, the metal cap layers 136 are not formed, and each of the gate structures 138 includes one of the remaining gate electrode layers 134' and one of the remaining gate dielectric layers 132'.

In some embodiments, the top surfaces 122'T of the remaining gate spacers 122' are substantially level with the top surfaces 138T of the gate structures 138. In some embodiments, the top surfaces 122'T of the gate spacers 122' are substantially higher than the top surfaces 138T of the gate structures 138.

Moreover, in some embodiments, the metal cap layers 136 is formed by a deposition process and a subsequent etching process. The deposition process may include a chemical vapor deposition (CVD) process, a physical vapor deposition (PVD) process, an atomic layer deposition (ALD) process, a spin-on process, another applicable process, or a combination thereof. Then, the etching process may include a dry etching process. In some embodiments, the gate spacers 122 are etched during the etching process for forming the metal cap layers 136, such that the top surfaces 122'T of the remaining gate spacers 122' are substantially level with the top surfaces 138T of the gate structures 138.

Figure 2B:
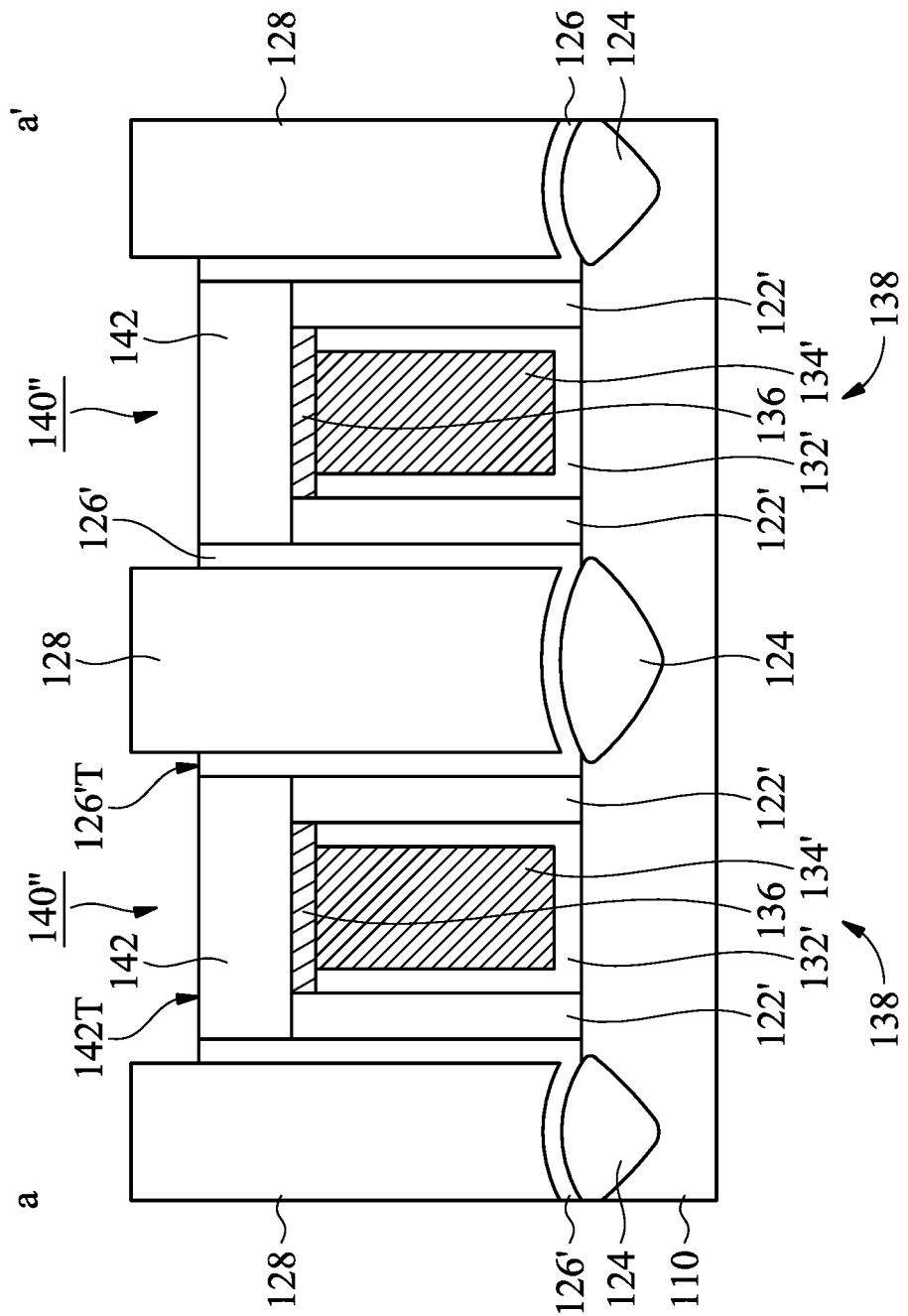

Next, first hard mask layers 142 are formed in the remaining openings 140' and over the remaining gate spacers 122' and the gate structures 138, as shown in FIGS. 1L and 2B in accordance with some embodiments. In some embodiments, a top portion of the CESL 126 is removed so that the remaining CESL 126' may be obtained, and the top surfaces 142T of the first hard mask layers 142 are substantially level with the top surface 126'T of the remaining CESL 126'. As a result, reduced openings 140" above the remaining CESL 126' and the first hard mark layers 142 are obtained.

More specifically, a first hard mask material (not shown) is filled in the remaining openings 140' by a deposition process, such as a chemical vapor deposition (CVD) process, an atomic layer deposition (ALD) process, or another applicable process. Afterwards, a planarization process, such as a grinding process, a chemical mechanical polishing (CMP) process, or an etching process is performed to expose the top surface of the ILD structure 128. Then, the first hard mask material and the CESL 126 are recessed (etched back) by an etching process to form the first hard mask layers 142 and the remaining CESL 126'.

In some embodiments, the first hard mask layers 142 are made of silicon oxide, silicon nitride, silicon oxynitride (SiON), silicon oxycarbide (SiOC), silicon carbonitride (SiCN), silicon oxide carbonitride (SiOCN), aluminum oxide, SiLK, or a combination thereof. It should be noted that each of the first hard mask layers 142 may be a single layer or may include multiple layers made of various materials, although only one layer is shown in FIGS. 1L and 2B, and the scope of the disclosure is not intended to be limiting.

Figure 2C:
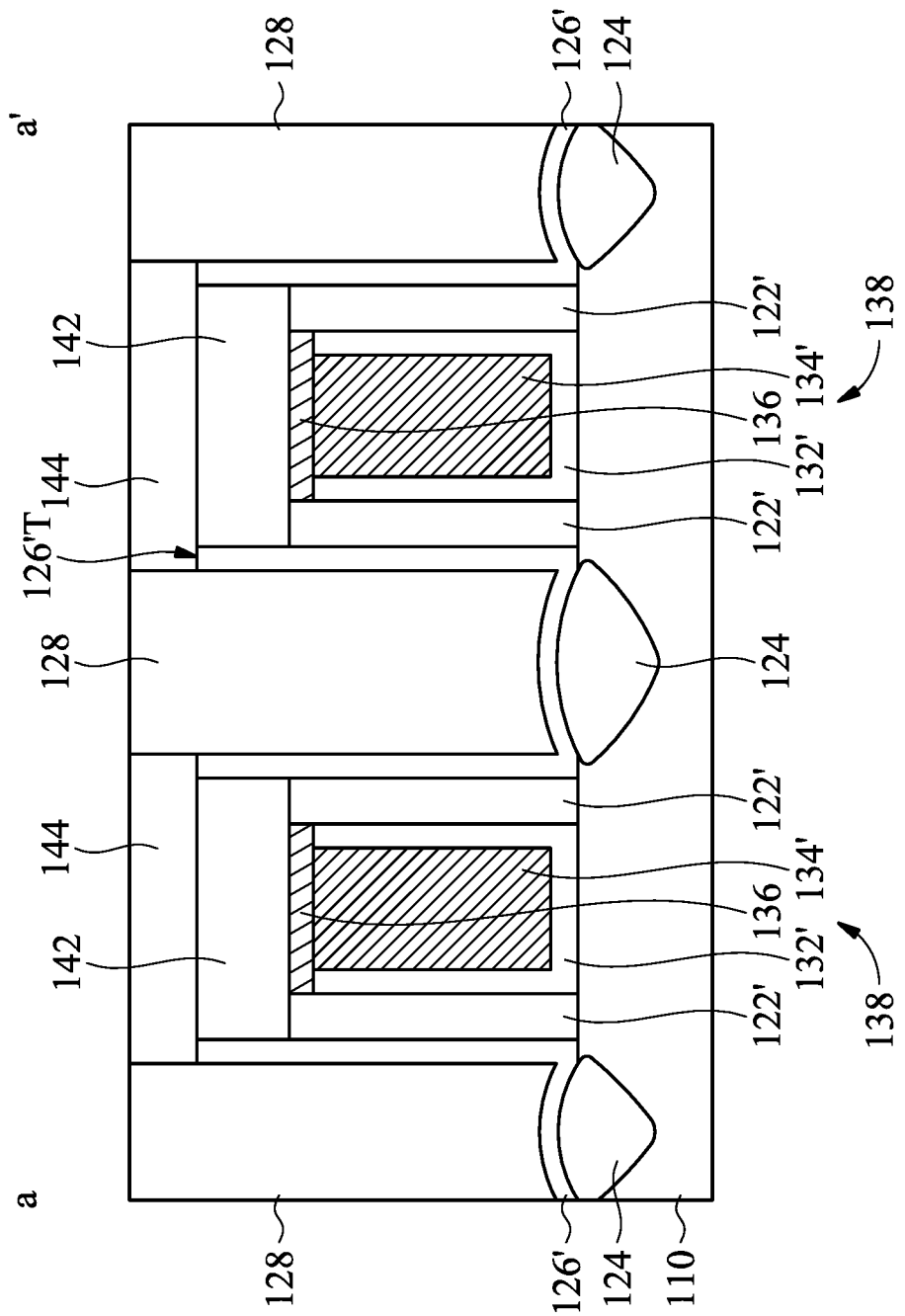

After the first hard mask layers 142 are formed, second hard mask layers 144 are formed in the reduced openings 140" above the first hard mask layers 142 and the remaining CESL 126', as shown in FIGS. 1M and 2C in accordance with some embodiments. In some embodiments, the second mask layers 144 adjoin the ILD structure 128, and the top surface 126'T of the remaining CESL 126' is covered by and in direct contact with the second hard mask layers 144.

In some embodiments, the second hard mask layers 144 are made of amorphous silicon (a-Si), zirconium oxide, tungsten, titanium nitride, or a combination thereof. It should be noted that the materials of the first hard mask layers 142 are different from the materials of the second hard mask layers 144, and the first hard mask layers 142 and the second hard mask layers 144 are configured to achieve different purposes.

More specifically, in order to improve the speed of the FinFET device structure 100a, the first hard mask layers 142, which will remain in the final structure (i.e. the FinFET device structure 100a), may be made of low-k dielectric materials. Moreover, in some embodiments, the materials of the first hard mask layers 142 are not easily interact with the gate structures 138 and should be easily removed during subsequent etching process for forming contacts electrically connected to the gate structures 138.

In addition, in some embodiments, the material of the second hard mask layers 144 is selected such that the etching rate of the second hard mask layers 144 is higher than the etching rate of the first hard mask layers 142 during subsequent etching process for forming openings, in which contacts electrically connected to the S/D structures 124 will be filled.

Moreover, in some embodiments, the second mask layers 144 are formed by a deposition process and a subsequent planarizing process, which is performed until the top surface of the ILD structure 128 is exposed. The deposition process may include a chemical vapor deposition (CVD) process, a physical vapor deposition (PVD) process, an atomic layer deposition (ALD) process, a spin-on process, another applicable process, or a combination thereof. The planarizing process may be a grinding process, a chemical mechanical polishing (CMP) process, or an etching process.

Figure 2D:
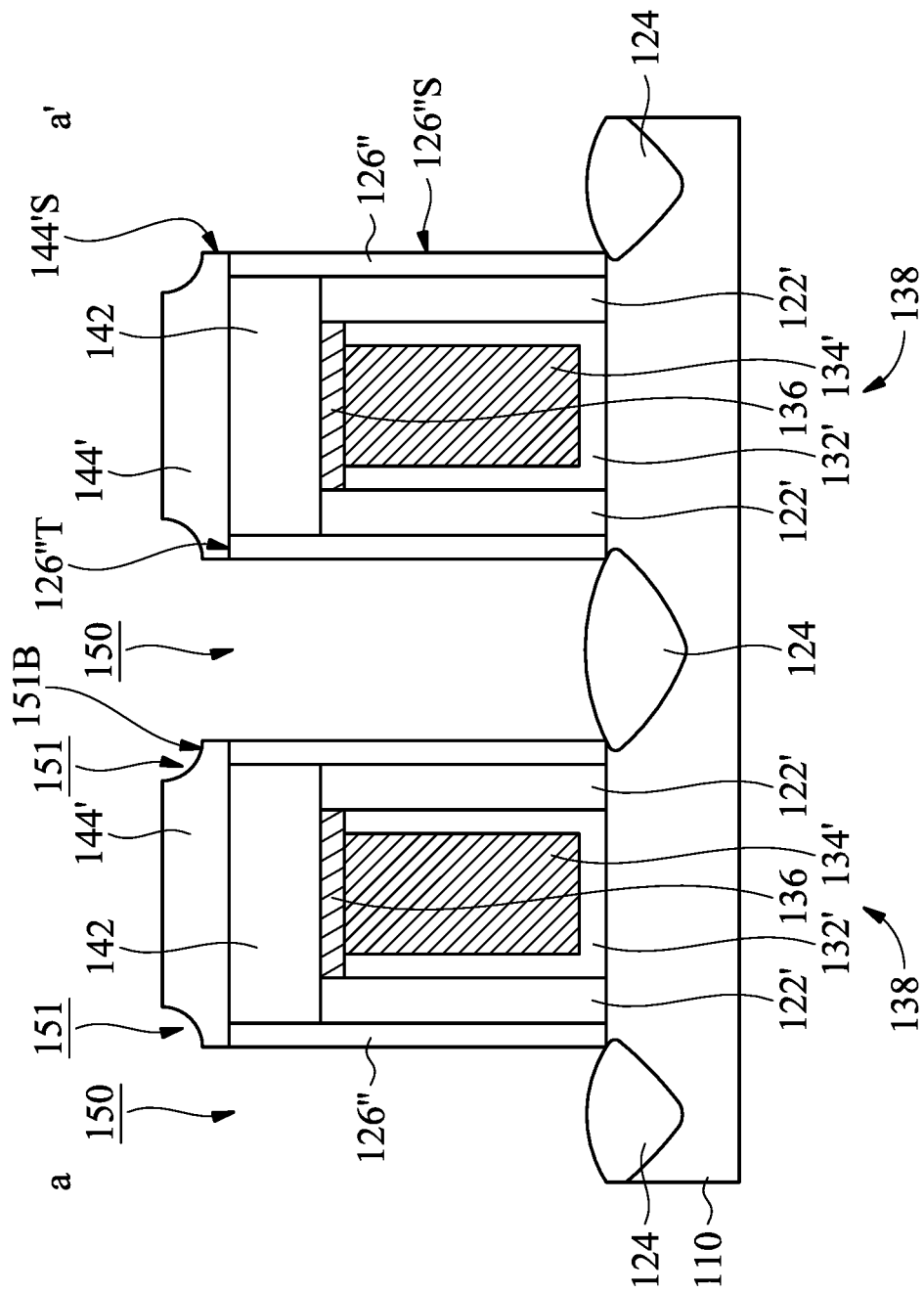

After the second hard mask layers 144 are formed, the ILD structure 128 is etched to form openings 150 exposing the S/D structures 124, as shown in FIGS. 1N and 2D in accordance with some embodiments. Specifically, the ILD structure 128, the remaining CESL 126' and the second hard mask layers 144 are partially removed by an etching process, such as a dry etching process. As a result, recesses 151 in the remaining second hard mask layers 144' and the openings 150 are formed simultaneously by the etching process.

The etching selectivity of the second hard mask layers 144 with respect to the ILD structure 128 may be high enough. Therefore, the etching process for forming the openings 150 is a self-aligned etching process. It should be noted that, in the etching process for forming the openings 150, the etching selectivity of the second hard mask layers 144 with respect to the ILD structure 128 is higher than the etching selectivity of the first hard mask layers 142 with respect to the ILD structure 128 in accordance with some embodiments of the disclosure. As a result, top portions of the second hard mask layers 144 are slightly removed while the first hard mask layers 142 are not removed.

More specifically, after the etching process for forming the openings 150 is performed, each of the second hard mask layers 144 has a thickness that gradually decreases along a direction from the gate structures 138 to the S/D structures 124, and the bottom surfaces 151B of the recesses 151 in the remaining second hard mask layers 144' are higher than the interfaces between the first hard mask layers 142 and the remaining second hard mask layers 144'.

In some embodiments, after the openings 150 and the recesses 151 are formed, the top surface 126"T of the remaining CESL 126" is still covered and in direct contact with the remaining second hard mask layers 144', and the sidewalls 144'S of the remaining second hard mask layers 144' are coplanar with the sidewalls 126"S of the remaining CESL 126". Since the first hard mask layers 142 and the gate structures 138 are protected by the second hard mask layers 144 during the etching process for forming the openings 150, the widths of the top surfaces of the first hard mask layers 142 are substantially the same as the width of the bottom surfaces of the first hard mask layers 142, and the gate structures 138 are not damaged by the etchant during the etching process.

Afterwards, contacts 152 are formed in the openings 150, and the remaining second hard mask layers 144' are removed such that the first hard mask layers 142 are exposed, as shown in FIGS. 1O and 2E in accordance with some embodiments. It should be noted that the contacts 152 are electrically connected to the S/D structures 124.

In some embodiments, the contacts 152 are formed by filling a conductive material (not shown) into the openings 150 and the recesses 151, and the conductive material is formed above the ILD structure 128 and the remaining second hard mask layers 144'. Then, a planarization process, such as a chemical mechanical polishing (CMP) process, is performed on the conductive material, the remaining second hard mask layers 144' and the ILD structure 128, such that the remaining second hard mask layers 144' are removed, and the top surfaces 142T of the first hard mask layers 142 and the top surface 126"T of the remaining CESL 126" are exposed. Afterwards, the remaining conductive material may be the contacts 152 electrically connected to the S/D structures 124. In some embodiments, the remaining conductive material is recessed to form contacts 152.

In some embodiments, the contacts 152 are made of tungsten (W), cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), or another applicable material. In some embodiments, the contacts 152 are formed by a deposition process, a planarization process and an etching process. The deposition process may include a chemical vapor deposition (CVD) process, a physical vapor deposition (PVD) process, an atomic layer deposition (ALD) process, a plating process, or another applicable process.

Figure 2F:
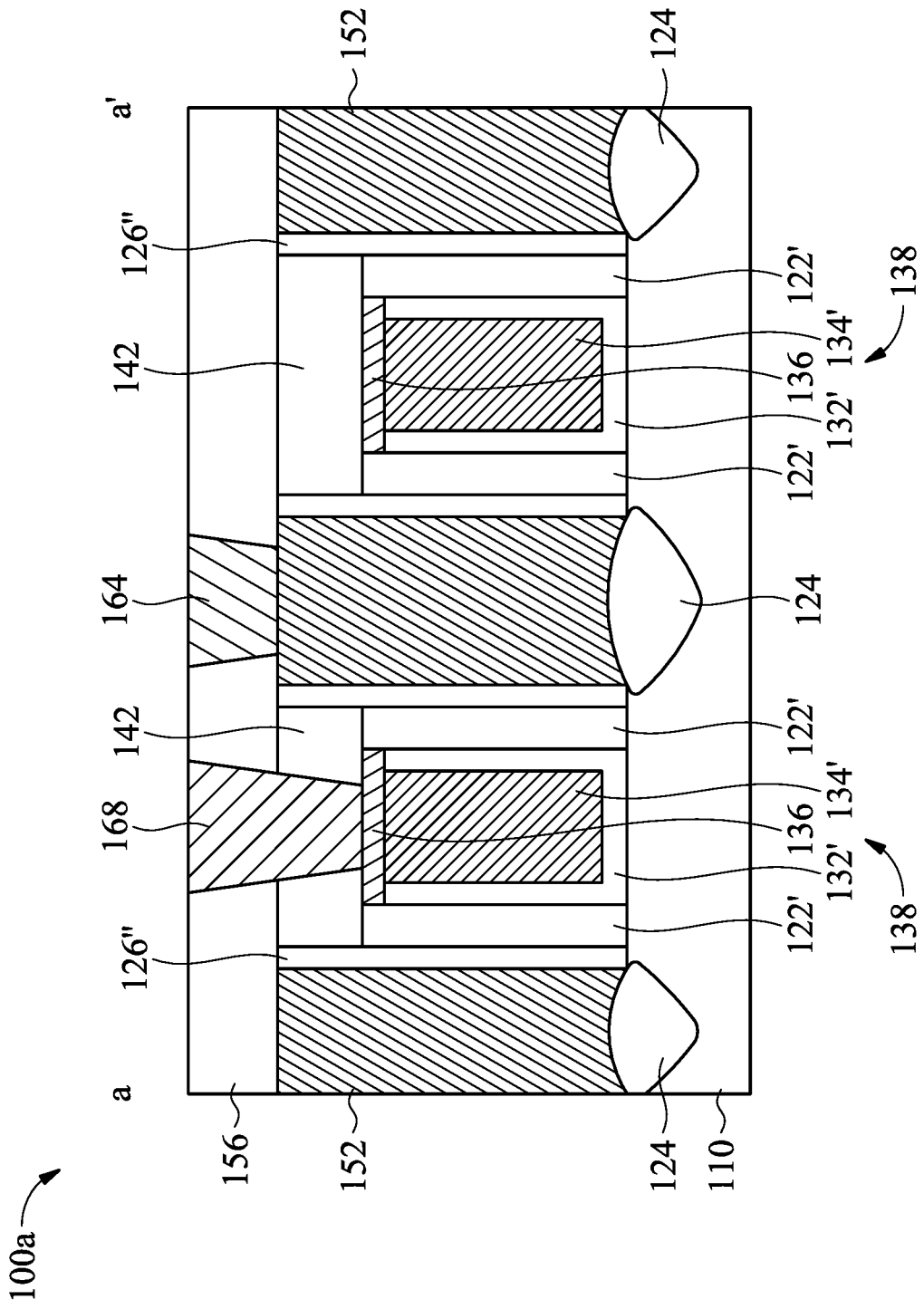

After the contacts 152 are formed and the remaining second hard mask layers 144' are removed, an etch stop layer (ESL) 156 is formed over the first hard mask layers 142, the remaining CESL 126", the ILD structure 128 and the contacts 152, as shown in FIGS. 1P and 2F in accordance with some embodiments. Moreover, a first conductive plug 168 is formed penetrating through the ESL 156 and one the first hard mask layers 142, and a second conductive plug 164 is formed penetrating through the ESL 156 in accordance with some embodiments. After the first conductive plug 168 and the second conductive plug 164 are formed, the FinFET device structure 100a is obtained.

In some embodiments, the ESL 156 is made of silicon carbide (SiC), silicon nitride (SiN), silicon carbonitride (SiCN), silicon oxycarbide (SiOC), silicon oxycarbon nitride (SiOCN), aluminum oxide or another applicable material. In some embodiments, the ESL 156 is formed by performing a plasma enhanced chemical vapor deposition (CVD) process, a low pressure CVD process, an atomic layer deposition (ALD) process, or another applicable process. It should be noted that there may be more than one first conductive plug 168, and there may be more than one second conductive plug 164, although only one first conductive plug 168 and one second conductive plug 164 are shown in FIGS. 1P and 2F.

More specifically, a first opening (not shown) may be formed penetrating through the ESL 158 and one the first hard mask layers 142 and exposing a portion of the underlying gate structure 138, and a second opening (not shown) may be formed penetrating through the ESL 156 and exposing a portion of the underlying contact 152. The first opening and the second opening may be independently or simultaneously formed by a self-aligned etching process.

Next, the first conductive plug 168 is formed in the first opening, and the second conductive plug 164 is formed in the second opening. In some embodiments, the first conductive plug 168 and the second conductive plug 164 are made of tungsten (W), cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), another applicable material, or a combination thereof.

In some embodiments, the first conductive plug 168 and the second conductive plug 164 are independently formed by a deposition process, such as a chemical vapor deposition (CVD) process, physical vapor deposition (PVD) process, atomic layer deposition (ALD) process, plating process or another applicable process. In some embodiments, the first conductive plug 168 and the second conductive plug 164 are simultaneously formed by a deposition process. In addition, the first conductive plug 168 is electrically connected to the underlying gate structure 138, and the second conductive plug 164 is electrically connected to the corresponding S/D structure 124 through the underlying contact 152.

In some embodiments of the present disclosure, since there are two hard mask layers (i.e. the first hard mask layers 142 and the second hard mask layers 144) over the gate structures 138, the properties of the hard mask layers can be flexibly adjusted. The second hard mask layers 144 may have higher etch resistance than the first hard mask layers 142 during the step of etching the ILD structure 128 for forming the openings 150. On the other hand, the materials of the first hard mask layers 142 may be selected from low-k dielectric materials so as to improve the speed of the FinFET device structure 100a.

In addition, in some embodiments, the dielectric constants of the second hard mask layers 144 are greater than the dielectric constants of the first hard mask layers 142. Therefore, the remaining second hard mask layers 144' are entirely removed during the planarization process for forming the contacts 152. However, in some embodiments, the remaining second hard mask layers 144' are not entirely removed.

Figure 3A:
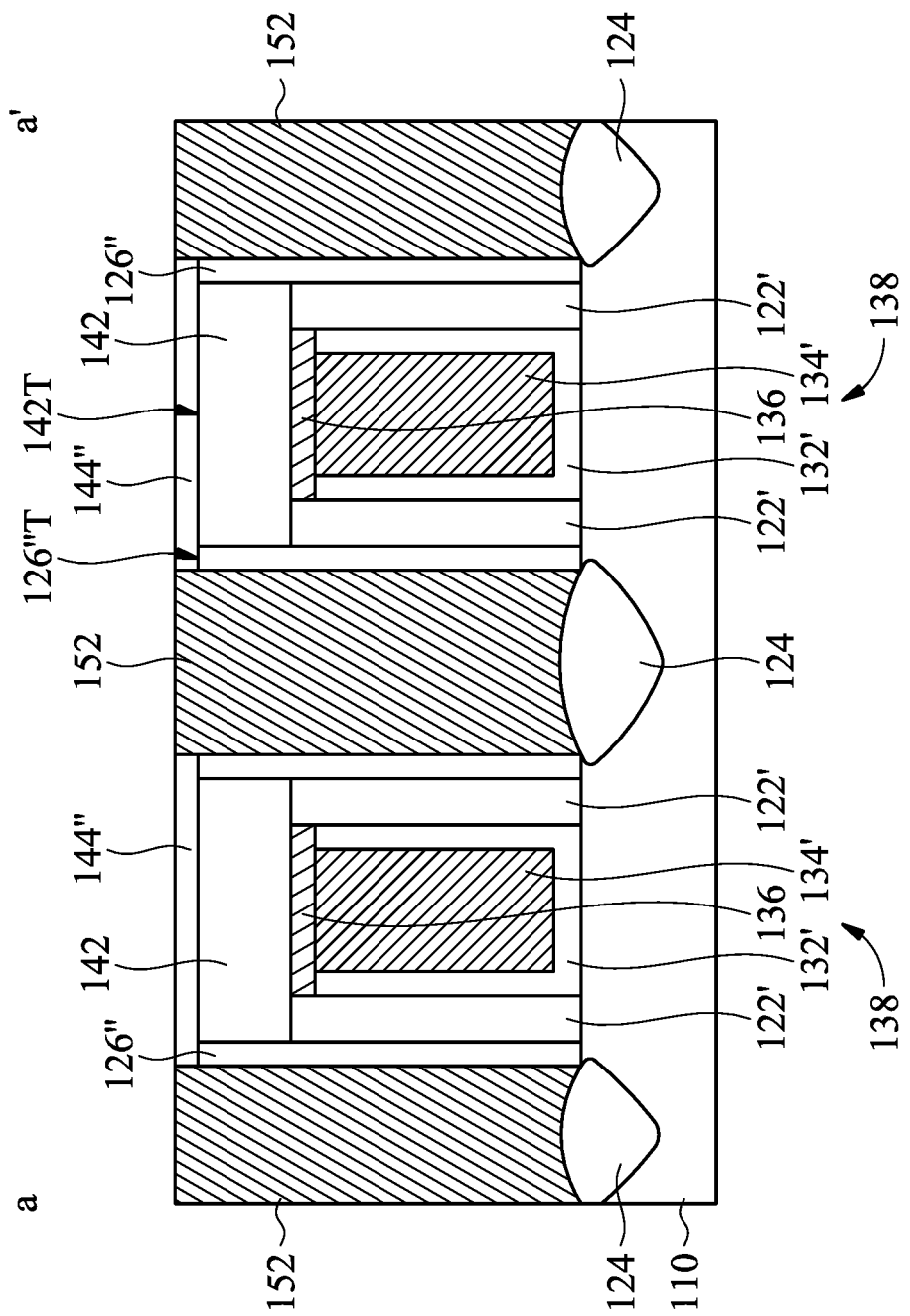
FIGS. 3A-3B are cross-sectional representations of various stages of forming a modified FinFET device structure after the structure of FIG. 1N, in accordance with some embodiments of the disclosure.
Figure 3B:
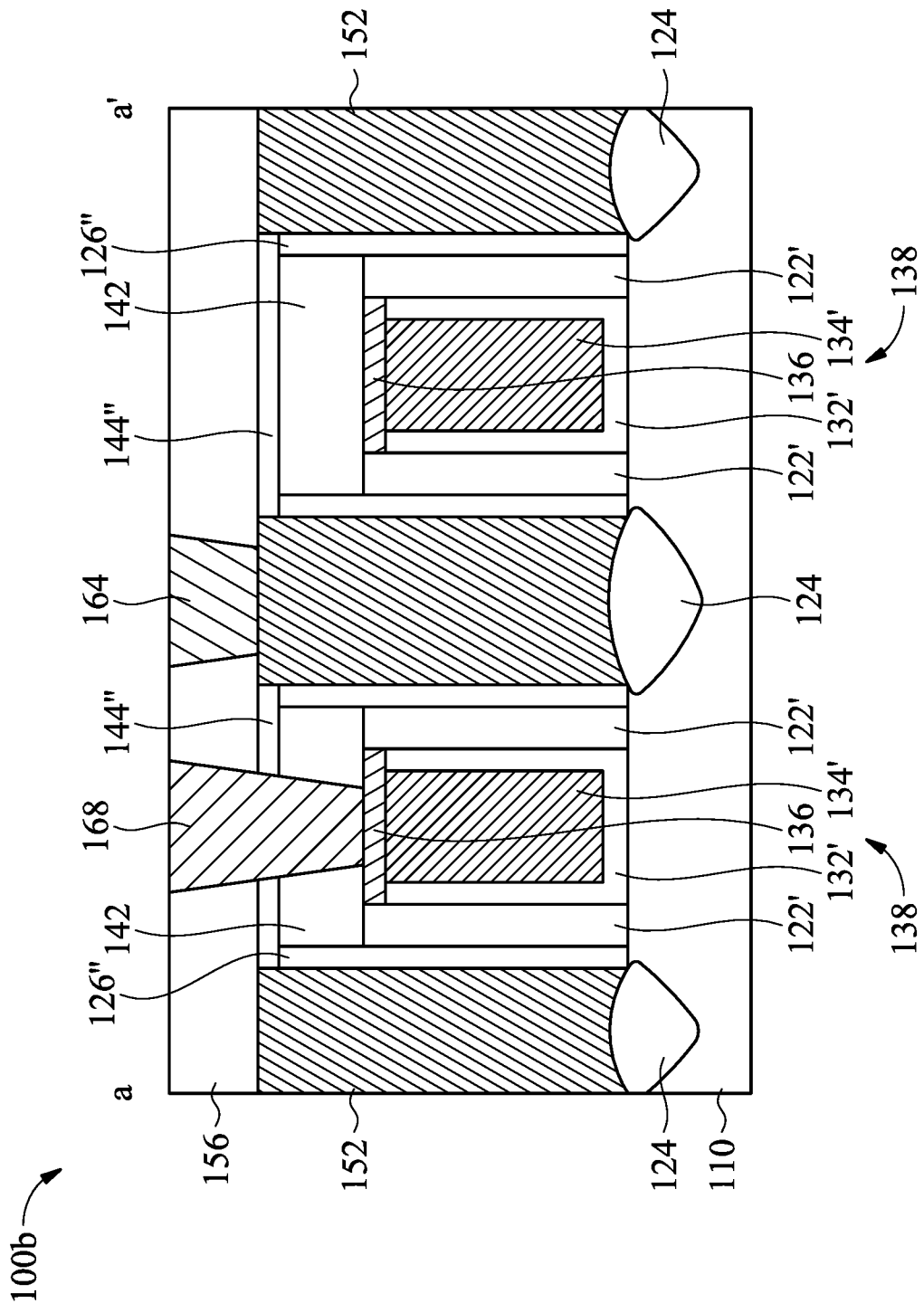

FIGS. 3A-3B are cross-sectional representations of various stages of forming a modified FinFET device structure 100b after the structure of FIG. 1N, in accordance with some embodiments of the disclosure. The steps for forming the FinFET device structure 100b shown in FIGS. 3A-3B may be similar to, or the same as the steps for forming the FinFET device structure 100a shown in FIGS. 2E and 2F, and the difference between them is that the remaining second hard mask layers 144' is not entirely removed during the planarization process for forming the contacts 152 in FIGS. 3A-3B.

After the openings 150 and the recesses 151 are formed, contacts 152 are formed in the openings 150, and the top portions of the remaining second hard mask layers 144' are removed while the first hard mask layers 142 are covered by the remaining second hard mask layers 144", as shown in FIG. 3A in accordance with some embodiments. More specifically, the top surface 126"T of the remaining CESL 126" and the top surfaces 142T of the first hard mask layers 142 are entirely covered by the remaining second hard mask layers 144" after the planarization process for forming the contacts 152.

Afterwards, the ESL 156, the first conductive plug 168 and the second conductive plug 164 are formed, as shown in FIG. 3B in accordance with some embodiments. Some processes and materials used to form the ESL 156, the first conductive plug 168 and the second conductive plug 164 of FIG. 3B may be similar to, or the same as, those used to form the ESL 156, the first conductive plug 168 and the second conductive plug 164 of FIG. 2F and are not repeated herein.

It should be noted that, since the first hard mask layers 142 remain covered by the remaining second hard mask layers 144" after the contacts 152 are formed, the first hard mask layers 142 and the gate structures 138 may be protected by the remaining second hard mask layers 144" during the etching process for forming the second conductive plug 164, such as the etching process for forming the second opening, in which the second conductive plug 164 is subsequently filled. In addition, the remaining second hard mask layers 144" is thin enough, such that the speed of the FinFET device structure 100a may not be substantially affected.

Figure 4:
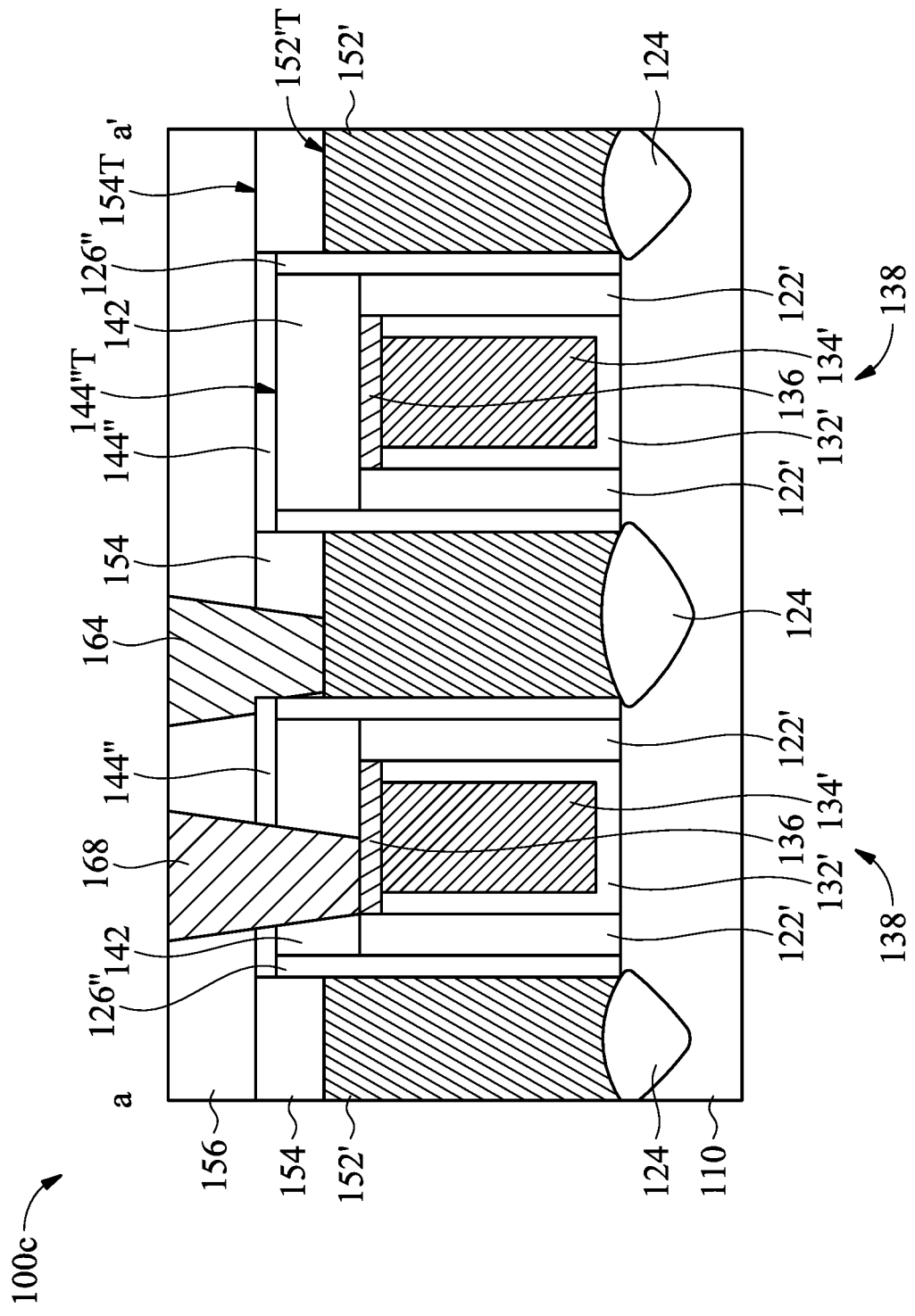
FIG. 4 is a cross-sectional representation of a modified FinFET device structure, in accordance with some embodiments of the disclosure.

FIG. 4 is a cross-sectional representation of a modified FinFET device structure 100c, in accordance with some embodiments of the disclosure. The FinFET device structure 100c may be similar to, or the same as the FinFET device structure 100b of FIG. 3B, and the differences between FIG. 4 and FIG. 3B is that the locations of the first conductive plug 168 and the second conductive plug 164 are slightly shifted, and third hard mask layers 154 are formed in FIG. 4.

In some embodiments, the remaining conductive material after the planarization process is recessed to form contacts 152'. As a result, the top surfaces 152'T of the contacts 152' are lower than the top surfaces 144"T of the remaining second hard mask layers 144". Next, the third hard mask layers 154 are formed over the contacts 152'.

In some embodiments, a third hard mask material (not shown) is formed over the contacts 152' and the remaining second hard mask layers 144" by a deposition process, such as a chemical vapor deposition (CVD) process, an atomic layer deposition (ALD) process, or another applicable process. Afterwards, a planarization process, such as a grinding process, a chemical mechanical polishing (CMP) process, or an etching process is performed on the third hard mask material to form the third hard mask layers 154. As a result, the top surfaces 144"T of the remaining second hard mask layers 144" are coplanar with the top surfaces 154T of the third hard mask layers 154 in accordance with some embodiments.

Moreover, the materials of the third hard mask layers 154 may be different from the materials of the remaining second hard mask layers 144". In some embodiments, the materials of the third hard mask layers 154 are similar to, or the same as, the materials of the first hard mask layers 142. Therefore, the remaining second hard mask layers 144" may be a stop layer during the planarization process for forming the third hard mask layers 154, and the first hard mask layers 142 may be protected by the remaining second hard mask layers 144".

However, in some embodiments, if the remaining second hard mask layers 144' are entirely removed during the planarization process for forming the contacts 152 (or the contacts 152'), such that the first hard mask layers 142 are exposed, the materials of the third hard mask layers 154 should be different from the materials of the first hard mask layers 142.

In some embodiments, the third hard mask layers 154 are made of silicon oxide, silicon nitride, silicon oxynitride (SiON), silicon oxycarbide (SiOC), silicon carbonitride (SiCN), silicon oxide carbonitride (SiOCN), aluminum oxide, SiLK, amorphous silicon (a-Si), zirconium oxide, tungsten, titanium nitride, or a combination thereof. It should be noted that each of the third hard mask layers 154 may be a single layer or may include multiple layers made of various materials, although only one layer is shown in FIG. 4, and the scope of the disclosure is not intended to be limiting.

After the third hard mask layers 154 are formed, the ESL 156, the first conductive plug 168 and the second conductive plug 164 are formed, as shown in FIG. 4 in accordance with some embodiments. Some processes and materials used to form the ESL 156, the first conductive plug 168 and the second conductive plug 164 of FIG. 4 may be similar to, or the same as, those used to form the ESL 156, the first conductive plug 168 and the second conductive plug 164 of FIG. 2F and are not repeated herein.

It should be noted that, since the first hard mask layers 142 are entirely covered by the remaining second hard mask layers 144" after the third hard mask layers 154 are formed, the first hard mask layers 142 can still be protected by the remaining second hard mask layers 144" during the etching process for forming the second conductive plug 164 even if the location of the second conductive plug 164 is slightly shifted, as shown in FIG. 4 in accordance with some embodiments.

In some embodiments, in the etching process for forming the second opening, in which the second conductive plug 164 is filled, the etching selectivity of the remaining second hard mask layers 144" with respect to the third hard mask layers 154 is higher than the etching selectivity of the first hard mask layers 142 with respect to the third hard mask layers 154.

Figure 5:
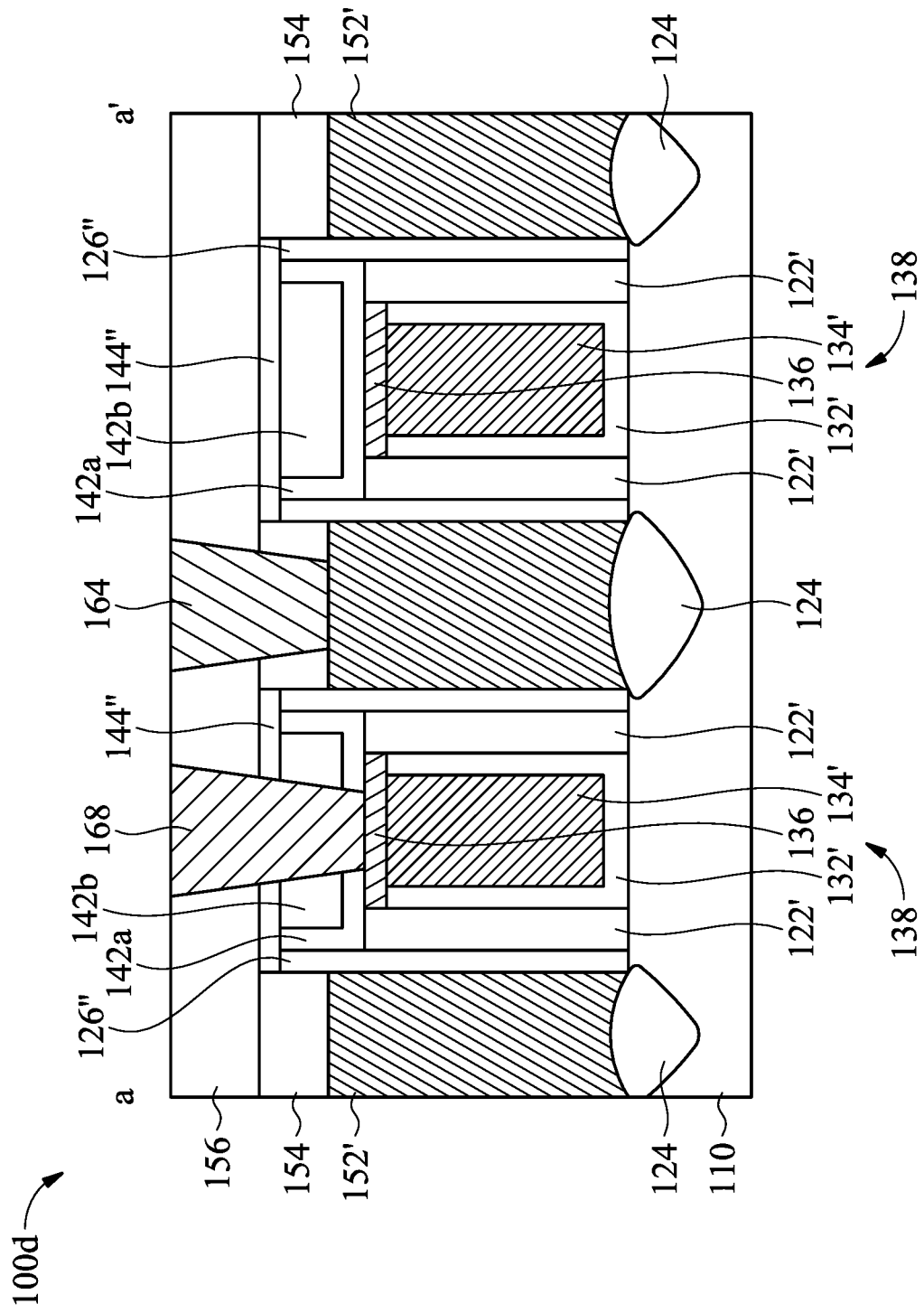
FIG. 5 is a cross-sectional representation of a modified FinFET device structure, in accordance with some embodiments of the disclosure.

FIG. 5 is a cross-sectional representation of a modified FinFET device structure 100d, in accordance with some embodiments of the disclosure. The FinFET device structure 100d may be similar to, or the same as the FinFET device structure 100b of FIG. 3B, and the differences between FIG. 5 and FIG. 3B is that the third hard mask layers 154 are formed, and the first hard mask layers 142 include multiple layers in FIG. 5.

More specifically, each of the first hard mask layers 142 may include a first sub-layer 142a and a second sub-layer 142b, and sidewalls and the bottom surface of the second sub-layer 142b are covered by the first sub-layer 142a. More specifically, the sidewalls and the bottom surfaces of the second sub-layers 142b are surrounded by the first sub-layers 142a while the top surfaces of the second sub-layers 142b are exposed by the first sub-layers 142a. In addition, the material of the first sub-layers 142a, the material of the second sub-layers 142b and the material of the remaining second hard mask layers 144" are different from one another.

In some embodiments, the first sub-layers 142a are made of silicon nitride or another applicable material, and the first sub-layers 142a may be formed by a deposition process, such as an atomic layer deposition (ALD) process or another applicable process. Moreover, the second sub-layers 142b may be made of silicon oxide or another applicable material, and the second sub-layers 142b may be formed by a deposition process, such as a chemical vapor deposition (CVD) process or another applicable process.

In some embodiments, the material of the first sub-layers 142a is the same as the material of the remaining CESL 126", such as silicon nitride. In some embodiments, the material of the second sub-layers 142b is the same as the material of the ILD structure 128, such as silicon oxide. Some processes and materials used to form the ESL 156, the first conductive plug 168 and the second conductive plug 164 of FIG. 5 may be similar to, or the same as, those used to form the ESL 156, the first conductive plug 168 and the second conductive plug 164 of FIG. 3B and are not repeated herein.

In the FinFET device structures 100a, 100b, 100c and 100d, the first hard mask layers 142 and the second hard mask layers 144 are formed over the gate structures 138. Therefore, the properties of the hard mask layers can be flexibly adjusted. The materials of the first hard mask layers 142 may be selected from low-k dielectric materials so as to improve the speed of the FinFET device structures 100a-100d, and the second hard mask layers 144 may have higher etch resistance than the first hard mask layers 142 during the step of etching the ILD structure 128 for forming the openings 150.

In the FinFET device structure 100a, since the dielectric constants of the second hard mask layers 144 are greater than the dielectric constants of the first hard mask layers 142, the remaining second hard mask layers 144' are entirely removed during the planarization process for forming the contacts 152. In the FinFET device structures 100b-100d, since the remaining second hard mask layers 144' are not entirely removed, the first hard mask layers 142 and the gate structures 138 can be protected by the remaining second hard mask layers 144" during the etching process for forming the second conductive plug 164.

Embodiments of a FinFET device structure and method for forming the same are provided. The method for forming the FinFET device structure may include forming a first hard mask layer over a gate structure, and forming a second hard mask layer over the first hard mask layer. The method may also include etching an ILD structure to form an opening exposing an S/D structure, and the opening and a recess in the second hard mask layer are formed simultaneously. The first hard mask layer, which remains in the final structure, may be made of low-k dielectric materials so as to improve the speed of the FinFET device structure. The materials of the second hard mask layer may be selected such that the etching rate of the second hard mask layers is higher than the etching rate of the first hard mask layers during subsequent etching process performed on the ILD structure to forming the opening.

In some embodiments, a method for forming a FinFET device structure is provided. The method for forming a FinFET device structure includes forming a fin structure over a substrate, and forming a source/drain (S/D) structure over the fin structure. The method for forming a FinFET device structure also includes forming an inter-layer dielectric (ILD) structure covering the S/D structure, and forming a gate structure over the fin structure and adjacent to the S/D structure. The method for forming a FinFET device structure further includes forming a first hard mask layer over the gate structure, and forming a second hard mask layer over the first hard mask layer. In addition, the method for forming a FinFET device structure includes etching the ILD structure to form an opening exposing the S/D structure. The opening and a recess in the second hard mask layer are formed simultaneously.

In some embodiments, a method for forming a FinFET device structure is provided. The method for forming a FinFET device structure includes forming a fin structure over a substrate, and forming a source/drain (S/D) structure over the fin structure. The method for forming a FinFET device structure also includes forming an inter-layer dielectric (ILD) structure covering the S/D structure, and forming a gate structure over the fin structure and adjacent to the S/D structure. The method for forming a FinFET device structure further includes forming a first hard mask layer over the gate structure, and forming a second hard mask layer over the first hard mask layer. In addition, the method for forming a FinFET device structure includes etching the ILD structure to form an opening exposing the S/D structure by performing an etching process. An etching selectivity of the second hard mask layer to the ILD structure is higher than an etching selectivity of the first hard mask layer to the ILD structure in the etching process.

In some embodiments, a FinFET device structure is provided. The FinFET device structure includes a fin structure formed over a substrate, and a gate structure formed over the fin structure. The FinFET device structure also includes a contact formed over the fin structure and adjacent to the gate structure, and a first hard mask layer formed over the gate structure. The first hard mask layer includes a first sub-layer and a second sub-layer, and a sidewall and a bottom surface of the second sub-layer is covered by the first sub-layer. The FinFET device structure further includes a second hard mask layer formed over the first hard mask layer. The material of the second hard mask layer, the material of the first sub-layer, and the material of the second sub-layer are different from one another.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a fin field effect transistor (FinFET) device structure, comprising:
   forming a fin structure over a substrate;
   forming a source/drain (S/D) structure over the fin structure;
   forming an inter-layer dielectric (ILD) structure covering the S/D structure;
   forming a gate structure over the fin structure and adjacent to the S/D structure;
   forming a first hard mask layer over the gate structure;
   forming a second hard mask layer over the first hard mask layer; and
   etching the ILD structure to form an opening exposing the S/D structure, wherein the opening and a recess in the second hard mask layer are formed simultaneously, and wherein an etching rate of the second hard mask layer is higher than an etching rate of the first hard mask layer during the step of etching the ILD structure.

2. The method for forming the fin field effect transistor (FinFET) device structure as claimed in claim 1, wherein a bottom surface of the recess is higher than an interface between the first hard mask layer and the second hard mask layer.

3. The method for forming the fin field effect transistor (FinFET) device structure as claimed in claim 1, further comprising:

forming a contact etch stop layer (CESL) between the ILD structure and the gate structure, wherein a top surface of the CESL is covered by the second hard mask layer after the opening and the recess are formed.

4. The method for forming the fin field effect transistor (FinFET) device structure as claimed in claim 3, further comprising:
filling a conductive material into the opening; and
polishing the conductive material and the second hard mask layer to expose the first hard mask layer and the CESL.

5. The method for forming the fin field effect transistor (FinFET) device structure as claimed in claim 4, further comprising:
recessing the conductive material to form a contact above the S/D structure after the first hard mask layer is exposed; and
forming a third hard mask layer over the contact, wherein a material of the third hard mask layer is different from a material of the first hard mask layer.

6. The method for forming the fin field effect transistor (FinFET) device structure as claimed in claim 1, wherein the step of forming the first hard mask layer further comprises:
forming a first sub-layer covering a sidewall of the ILD structure and a top surface of the gate structure; and
forming a second sub-layer over the first sub-layer, wherein a material of the second sub-layer is the same as a material of the ILD structure.

7. The method for forming the fin field effect transistor (FinFET) device structure as claimed in claim 6, further comprising:
forming a contact etch stop layer (CESL) over a sidewall of the gate structure, wherein the CESL is between the ILD structure and the gate structure; and
removing a portion of the first sub-layer, a portion of the second sub-layer, and a portion of the CESL, wherein a material of the first sub-layer is the same as a material of the CESL.

8. A method for forming a fin field effect transistor (FinFET) device structure, comprising:
forming a fin structure over a substrate;
forming a source/drain (S/D) structure over the fin structure;
forming an inter-layer dielectric (ILD) structure covering the S/D structure;
forming a gate structure over the fin structure and adjacent to the S/D structure;
forming a first hard mask layer over the gate structure;
forming a second hard mask layer over the first hard mask layer; and
etching the ILD structure to form an opening exposing the S/D structure by performing an etching process, wherein an etching selectivity of the second hard mask layer to the ILD structure is higher than an etching selectivity of the first hard mask layer to the ILD structure in the etching process, and wherein a top portion of the second hard mask layer is removed during the etching process, such that the second hard mask layer has a thickness that gradually decreases along a direction from the gate structure to the S/D structure.

9. The method for forming the fin field effect transistor (FinFET) device structure as claimed in claim 8, wherein a width of a top surface of the first hard mask layer is substantially the same as a width of a bottom surface of the first hard mask layer after the opening is formed.

10. The method for forming the fin field effect transistor (FinFET) device structure as claimed in claim 8, wherein the first hard mask layer comprises a material that is the same as a material of the ILD structure.

11. The method for forming the fin field effect transistor (FinFET) device structure as claimed in claim 8, further comprising:
forming a contact etch stop layer (CESL) between the ILD structure and the gate structure, wherein a sidewall of the second hard mask layer is coplanar with a sidewall of the CESL after the S/D structure is exposed by the opening.

12. The method for forming the fin field effect transistor (FinFET) device structure as claimed in claim 8, further comprising:
forming a gate spacer on a sidewall of the gate structure, wherein a top surface of the gate spacer is substantially level with a top surface of the gate structure, and the first hard mask layer is in direct contact with the gate spacer and the gate structure.

13. The method for forming the fin field effect transistor (FinFET) device structure as claimed in claim 8, further comprising:
filling a conductive material into the opening; and
removing the second hard mask layer and a portion of the conductive material to form a contact, wherein a top surface of the first hard mask layer is coplanar with a top surface of the contact.

14. The method for forming the fin field effect transistor (FinFET) device structure as claimed in claim 13, further comprising:
forming an etch stop layer (ESL) covering the top surface of the first hard mask layer and the top surface of the contact;
forming a first conductive plug penetrating through the ESL and the first hard mask layer, wherein the first conductive plug is electrically connected to the gate structure; and
forming a second conductive plug penetrating through the ESL, wherein the second conductive plug is electrically connected to the S/D structure via the contact.

15. The method for forming the fin field effect transistor (FinFET) device structure as claimed in claim 8, further comprising:
filling a conductive material into the opening; and
polishing the conductive material and the second hard mask layer so that a top surface of the second hard mask layer is coplanar with a top surface of the conductive material.

16. A method for forming a fin field effect transistor (FinFET) device structure, comprising:
forming a fin structure over a substrate;
forming a source/drain (S/D) structure over the fin structure;
forming a contact etch stop layer (CESL) and an inter-layer dielectric (ILD) structure covering the S/D structure;
forming a gate structure over the fin structure and adjacent to the S/D structure, wherein the CESL is between the ILD structure and the gate structure;
forming a first hard mask layer over the gate structure;
forming a second hard mask layer over the first hard mask layer and the CESL; and
etching the ILD structure to form an opening exposing the S/D structure, wherein a first width of a bottommost surface of the second hard mask layer facing the substrate is greater than a second width of a topmost surface of the second hard mask layer facing away from the substrate after etching the ILD structure.

17. The method for forming the fin field effect transistor (FinFET) device structure as claimed in claim 16, further comprising:
    forming gate spacers on opposite sidewalls of the gate structure;
    performing a first etching process on the gate spacers and the gate structure, wherein a top surface of the gate spacers is substantially level with a top surface of the gate structure after the first etching process; and
    performing a second etching process on the gate spacers and the gate structure, wherein the top surface of the gate spacers is higher than the top surface of the gate structure after the second etching process.

18. The method for forming the fin field effect transistor (FinFET) device structure as claimed in claim 16, further comprising:
    forming a metal cap layer on the gate structure between the gate spacers, wherein the metal cap layer is between the gate structure and the first hard mask layer.

19. The method for forming the fin field effect transistor (FinFET) device structure as claimed in claim 18, wherein a sidewall of the first hard mask layer is covered by the CESL after etching the ILD structure.

20. The method for forming the fin field effect transistor (FinFET) device structure as claimed in claim 18, wherein an entirety of a top surface of the first hard mask layer is covered by the second hard mask layer after etching the ILD structure.

* * * * *